United States Patent
Takahashi et al.

(10) Patent No.: US 11,817,780 B2
(45) Date of Patent: Nov. 14, 2023

(54) POWER SUPPLY CIRCUIT AND SEMICONDUCTOR DEVICE INCLUDING THE POWER SUPPLY CIRCUIT

(71) Applicant: SEMICONDUCTOR ENERGY LABORATORY CO., LTD., Atsugi (JP)

(72) Inventors: Kei Takahashi, Kanagawa (JP); Takeshi Aoki, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 374 days.

(21) Appl. No.: 17/288,957

(22) PCT Filed: Oct. 21, 2019

(86) PCT No.: PCT/IB2019/058933
§ 371 (c)(1),
(2) Date: Apr. 27, 2021

(87) PCT Pub. No.: WO2020/089725
PCT Pub. Date: May 7, 2020

(65) Prior Publication Data
US 2021/0408902 A1     Dec. 30, 2021

(30) Foreign Application Priority Data
Nov. 2, 2018   (JP) .................. 2018-207319

(51) Int. Cl.
*H02M 3/155*     (2006.01)
*H02M 1/00*     (2006.01)
(Continued)

(52) U.S. Cl.
CPC .......... *H02M 3/155* (2013.01); *H01L 27/124* (2013.01); *H01L 27/1207* (2013.01);
(Continued)

(58) Field of Classification Search
CPC .. H02M 3/155; H02M 1/0025; H01L 27/1225
See application file for complete search history.

(56) References Cited

U.S. PATENT DOCUMENTS 4,686,340 A * 8/1987 Fukasawa .............. H05B 6/062
219/664
8,610,696 B2   12/2013 Kurokawa
(Continued)

FOREIGN PATENT DOCUMENTS

| CN | 001677511 A | 10/2005 |
|----|-------------|---------|
| JP | 10-116423 A | 5/1998 |

(Continued)

OTHER PUBLICATIONS

International Search Report (Application No. PCT/IB2019/058933) dated Jan. 28, 2020.
(Continued)

*Primary Examiner* — Adolf D Berhane
*Assistant Examiner* — Afework S Demisse
(74) *Attorney, Agent, or Firm* — Fish & Richardson P.C.

(57) ABSTRACT

A power supply circuit with a novel structure is provided. The power supply circuit includes a power converter circuit supplying power to a load; a current sensing circuit generating a first signal including data on a current flowing through the load; a voltage sensing circuit generating a second signal including data on a voltage applied to the load; a correction circuit that includes a digital filter, a digital-analog converter circuit to which a signal output from the digital filter is input, and a sample-and-hold circuit for retaining a signal output from the digital-analog converter circuit and generates a third signal obtained by correcting the second signal; a selection circuit selecting the first signal or the third signal; an output circuit generating an output signal for controlling the power converter circuit in accordance with the signal selected by the selection circuit; and a
(Continued)

control signal generation circuit controlling switching between a first operation for generating the output signal in accordance with the first signal and generating the third signal and a second operation for generating the output signal in accordance with the third signal.

5 Claims, 19 Drawing Sheets

(51) Int. Cl.
    *H01L 27/12*     (2006.01)
    *H01L 29/786*     (2006.01)
    *H10B 12/00*     (2023.01)

(52) U.S. Cl.
    CPC ...... *H01L 27/1225* (2013.01); *H01L 27/1255* (2013.01); *H01L 29/7869* (2013.01); *H01L 29/78648* (2013.01); *H02M 1/0009* (2021.05); *H10B 12/00* (2023.02)

(56) References Cited

U.S. PATENT DOCUMENTS

| | | | |
|---|---|---|---|
| 9,231,475 | B2 | 1/2016 | Takahashi |
| 9,304,523 | B2 | 4/2016 | Takahashi et al. |
| 2005/0213449 | A1 | 9/2005 | Kamiya et al. |
| 2011/0199351 | A1 | 8/2011 | Kurokawa |
| 2013/0193874 | A1 | 8/2013 | Takahashi et al. |
| 2015/0249385 | A1 | 9/2015 | Takahashi |

FOREIGN PATENT DOCUMENTS

| | | |
|---|---|---|
| JP | 2005-276289 A | 10/2005 |
| JP | 2011-188477 A | 9/2011 |
| JP | 2013-178495 A | 9/2013 |
| JP | 2014-203764 A | 10/2014 |
| JP | 2015-180178 A | 10/2015 |
| KR | 2013-0036195 A | 4/2013 |
| KR | 2013-0088060 A | 8/2013 |
| TW | 200605050 | 2/2006 |
| TW | 201215122 | 4/2012 |
| TW | 201346482 | 11/2013 |
| TW | 201541836 | 11/2015 |
| WO | WO-2011/099368 | 8/2011 |

OTHER PUBLICATIONS

Written Opinion (Application No. PCT/IB2019/058933) dated Jan. 28, 2020.

\* cited by examiner

POWER SUPPLY CIRCUIT AND SEMICONDUCTOR DEVICE INCLUDING THE POWER SUPPLY CIRCUIT

CROSS REFERENCE TO RELATED APPLICATIONS

This application is a U.S. National Phase Application under 35 U.S.C. § 371 of International Application PCT/IB2019/058933, filed on Oct. 21, 2019, which is incorporated by reference and claims the benefit of a foreign priority application filed in Japan on Nov. 2, 2018, as Application No. 2018-207319.

TECHNICAL FIELD

One embodiment of the present invention relates to a power supply circuit and a semiconductor device including the power supply circuit.

Note that one embodiment of the present invention is not limited to the above technical field. The technical field of one embodiment of the invention disclosed in this specification and the like relates to an object, a method, or a manufacturing method. One embodiment of the present invention relates to a process, a machine, manufacture, or a composition of matter. Accordingly, specific examples of the technical field of one embodiment of the present invention disclosed in this specification include a semiconductor device, a display device, a liquid crystal display device, a light-emitting device, a lighting device, a power storage device, a memory device, a driving method thereof, and a manufacturing method thereof.

BACKGROUND ART

A power supply circuit such as a DCDC converter is a constant voltage circuit in which a constant output voltage can be obtained regardless of a value of an input voltage. Switching-mode DCDC converters that are generally used are roughly divided into two feedback modes: a voltage control mode in which data on an output voltage is fed back to a controller and a current control mode in which data on an output current is fed back to a controller. The following Patent Document 1 discloses a power supply circuit that can be operated by switching between current control in which driving is controlled based on data on current flowing through a load and voltage control in which driving is controlled based on data on voltage applied to a load.

REFERENCE

Patent Document

[Patent Document 1] Japanese Published Patent Application No. 2013-178495

SUMMARY OF THE INVENTION

Problems to be Solved by the Invention

In a voltage control mode, it is important for outputting a constant current by a power supply circuit that the influence of a high frequency noise on data on an output voltage is decreased. In order to reduce the influence of the noise, an RC filter using a capacitor or a resistor is used. A capacitor provided for removing the noise has high capacity. In the case of the RC filter, filter characteristics cannot be set freely. A power supply circuit in which the filter characteristics can be set freely or the influence of noise can be reduced without a high-capacity capacitor is desired.

Furthermore, one of the important points for evaluating the performance of a power supply circuit is that the power supply circuit keeps outputting a constant voltage at the timing of switching when being operated by switching between a current control mode and a voltage control mode. In a structure in which an RC filter is necessary for reducing the influence of a high frequency noise on data on an output voltage every time a current control mode is changed to a voltage control mode, a smooth mode shift may be difficult. In the case where a digital filter is used instead of an RC filter, a circuit configuration with high power consumption such as a digital-analog converter circuit is needed, which may increase power consumption.

In view of the above technical background, an object of one embodiment of the present invention is to provide a power supply circuit with a novel structure in which the influence of noise is reduced. Another object of one embodiment of the present invention is to provide a power supply circuit with a novel structure capable of reducing power consumption. Another object of one embodiment of the present invention is to reduce power consumption of a semiconductor device using the power supply circuit and a battery or a lighting device provided with the semiconductor device.

Note that the description of these objects does not preclude the existence of other objects. One embodiment of the present invention does not have to achieve all these objects. Note that objects other than these will be apparent from the description of the specification, the drawings, the claims, and the like, and objects other than these can be derived from the description of the specification, the drawings, the claims, and the like.

Means for Solving the Problems

One embodiment of the present invention is a power supply circuit including a power converter circuit supplying power to a load; a current sensing circuit generating a first signal including data on current flowing through the load; a voltage sensing circuit generating a second signal including data on voltage applied to the load; a correction circuit that includes a digital filter, a digital-analog converter circuit to which a signal output from the digital filter is input, and a sample-and-hold circuit for retaining a signal output from the digital-analog converter circuit and generates a third signal obtained by correcting the second signal; a selection circuit selecting the first signal or the third signal; an output circuit generating an output signal for controlling the power converter circuit in accordance with a signal selected by the selection circuit; and a control signal generation circuit controlling switching between a first operation for generating the output signal in accordance with the first signal and generating the third signal and a second operation for generating the output signal in accordance with the third signal.

In one embodiment of the present invention, the power supply circuit in which the sample-and-hold circuit includes a first transistor and a first capacitor and the first transistor includes an oxide semiconductor in a channel formation region is preferable.

In one embodiment of the present invention, the power supply circuit in which the selection circuit includes a first wiring electrically connected to a second capacitor, a second wiring electrically connected to a third capacitor, and a change-over switch, and the change-over switch can switch the first operation and the second operation so that in the first operation, the first signal is retained in the first wiring and the first signal is input to the output circuit and in the second operation, the third signal is retained in the second wiring and the second signal is input to the output circuit is preferable.

In one embodiment of the present invention, the power supply circuit in which a precharge circuit is included and the change-over switch has a function of switching the precharge circuit so as to precharge the second wiring in the first operation and to precharge the first wiring in the second operation.

One embodiment of the present invention is a semiconductor device including the power supply circuit and a processor.

Note that other embodiments of the present invention will be shown in the description of the following embodiments and the drawings.

Effect of the Invention

According to one embodiment of the present invention, a power supply circuit with a novel structure in which the influence of noise is reduced can be provided. Alternatively, according to one embodiment of the present invention, a power supply circuit with a novel structure capable of reducing power consumption can be provided. Alternatively, one embodiment of the present invention can reduce power consumption by a semiconductor device using the power supply circuit and a battery or a lighting device provided with the semiconductor device.

Note that the description of these effects does not preclude the existence of other effects. One embodiment of the present invention does not have to have all these effects. Note that effects other than these will be apparent from the description of the specification, the drawings, the claims, and the like, and effects other than these can be derived from the description of the specification, the drawings, the claims, and the like.

MODE FOR CARRYING OUT THE INVENTION

Figure 1A:
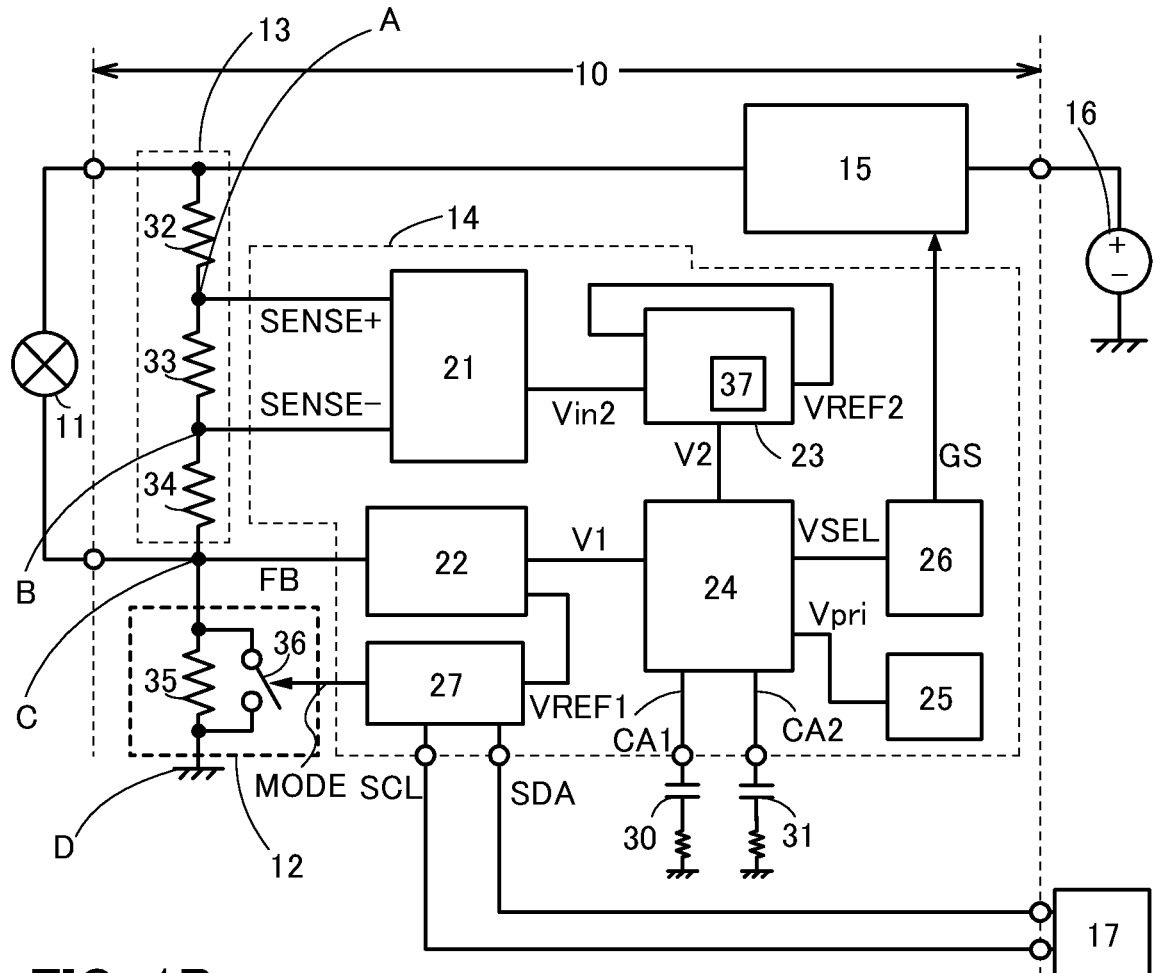
FIG. 1A and FIG. 1B are diagrams for explaining a configuration of a power supply circuit.

Hereinafter, embodiments will be described with reference to the drawings. Note that the embodiments can be implemented with many different modes, and it is readily appreciated by those skilled in the art that modes and details can be changed in various ways without departing from the spirit and scope of the present invention. Thus, the present invention should not be construed as being limited to the following description of the embodiments.

Note that ordinal numbers such as "first," "second," and "third" in this specification and the like are used in order to avoid confusion among components. Thus, the ordinal numbers do not limit the number of components. In addition, the ordinal numbers do not limit the order of components. Furthermore, in this specification and the like, for example, a "first" component in one embodiment can be referred to as a "second" component in other embodiments or claims. Moreover, in this specification and the like, for example, a "first" component in one embodiment can be omitted in other embodiments or claims.

Note that in the drawings, the same elements, elements having similar functions, elements formed of the same material, elements formed at the same time, or the like are sometimes denoted by the same reference numerals, and repeated description thereof is omitted in some cases.

Embodiment 1

In this embodiment, a power supply circuit of one embodiment of the present invention will be described.

Although in block diagrams, components are classified by their functions and illustrated as independent blocks, it is difficult to completely divide actual components according to their functions and one component can relate to a plurality of functions.

FIG. 1A illustrates a power supply circuit 10, a load 11, a power source 16, and a processor 17. Note that the power supply circuit 10 may also be referred to as a DCDC converter, a stabilized circuit, and the like. Note that in this specification and the like, a semiconductor device generally means a device that can function by utilizing semiconductor characteristics. Therefore, the whole device including the load 11, the power source 16, and/or the processor 17 in addition to the power supply circuit 10 provided with a semiconductor element such as a transistor is referred to as a semiconductor device.

The power supply circuit 10 includes a power converter circuit 15, a voltage control circuit 14, a voltage data sensing portion 13, a current data sensing portion 12, a capacitor 30, and a capacitor 31. Note that the capacitor 30 and the capacitor 31 have a function for retaining the potentials in the power supply circuit 10. The capacitor 30 and the capacitor 31 can be omitted by an increase of the capacity in the power supply circuit 10 or the like.

The power converter circuit 15 has a function of supplying power to the load 11. The power converter circuit 15 has a function of converting an input voltage that is supplied from the power source 16 such as a voltage source to the power supply circuit 10 to an output voltage. The voltage control circuit 14 has a function of controlling the level of the output voltage generated in the power converter circuit 15.

The power supply circuit 10 has a function of generating a signal including data on current flowing through the load 11 (hereinafter, referred to as a current signal) and a signal including data on voltage applied to the load 11 (hereinafter, referred to as a voltage signal). The power supply circuit 10 has a function of correcting the voltage signal. The power supply circuit 10 has a function of controlling the driving of the power converter circuit 15 by switching between the current signal and the voltage signal.

The current data sensing portion 12 has a function of generating the current signal. The current data sensing portion 12 includes a resistor 35 and a switch 36, for example. The resistor 35 and the switch 36 are electrically connected to each other in parallel, and the resistor 35 is electrically connected to the load 11 in series. Of a pair of terminals included in the resistor 35, one terminal connected to the load 11 is referred to as a node C, and the other terminal is referred to as a node D, in which case a value of the potential of the node C at the time when the switch 36 is off is determined depending on a value of current flowing through the resistor 35 if the resistance value of the resistor 35 and the potential of the node D are fixed. A signal FB including the potential of the node C is supplied to the voltage control circuit 14 as the current signal.

The voltage data sensing portion 13 has a function of generating the voltage signal. The voltage data sensing portion 13 includes a resistor 32, a resistor 33, and a resistor 34, for example. The resistor 32, the resistor 33, and the resistor 34 are electrically connected in series. Furthermore, the load 11 is electrically connected, in parallel, to the resistor 32, the resistor 33, and the resistor 34. One terminal of a pair of terminals included in the resistor 32 and one terminal of a pair of terminals included in the resistor 33 are connected to each other, and the connected terminals correspond to a node A. The other terminal of the pair of terminals included in the resistor 33 and one terminal of a pair of terminals included in the resistor 34 are connected to each other, and the connected terminals correspond to a node B. The potentials of the node A and the node B are determined depending on values of voltages applied to the other terminal of the pair of terminals included in the resistor 32 and the other terminal of the pair of terminals included in the resistor 34 (also corresponding to the node C). A signal SENSE+ including the potential of the node A and a signal SENSE− including the potential of the node B are supplied to the voltage control circuit 14 as the voltage signals.

The voltage control circuit 14 includes a voltage sensing circuit 21, a current sensing circuit 22, a correction circuit 23, a selection circuit 24, a precharge circuit 25, an output circuit 26, and a control signal generation circuit 27, for example.

The voltage signals based on the signal SENSE+ and the signal SENSE− are input to the voltage sensing circuit 21. The voltage sensing circuit 21 has a function of generating a signal Vin2 including data on voltage based on the voltage signal.

The current signal based on the signal FB and a reference voltage VREF1 are input to the current sensing circuit 22. The current sensing circuit 22 has a function of generating a signal V1 including data on current based on the current signal.

The correction circuit 23 includes a filter circuit 37. The filter circuit 37 is a digital filter, whereby noise can be removed without a change of filter characteristics and the use of a high-capacity capacitor. The signal Vin2 is input to the correction circuit 23. The filter circuit 37 generates a corrected reference voltage VREF2 by reducing the influence of noise by the signal Vin2. Correction using the reference voltage VREF2 based on a direct current component can be performed. The correction circuit 23 has a function of generating a signal V2 including the data on voltage based on the voltage signal in accordance with the signal Vin2 and the reference voltage VREF2. Note that noise corresponds to a signal with a high-frequency component of 1 kHz or higher. The correction using the VREF2 based on a direct current component can be performed. Although not illustrated in FIG. 1A, the correction circuit 23 includes an analog-digital converter circuit to which the signal V2 is input, a digital-analog converter circuit to which a signal output from the filter circuit 37 is input, and a sample-and-hold circuit for retaining a signal output from the digital-analog converter circuit.

The selection circuit 24 includes a plurality of wirings and a plurality of change-over switches. The selection circuit 24 has a function of, by switching the change-over switches, selecting the signal V1 or the signal V2 and outputting the selected signal to the output circuit 26 as a signal VSEL. The selection circuit 24 makes the signal V1 retained in a wiring CA1 and makes the signal V2 retained in a wiring CA2. The wiring CA1 is connected to the capacitor 30, for example. The wiring CA2 is connected to the capacitor 31, for example.

The selection circuit 24 has a function of switching the change-over switches so as to perform selective precharge of the wiring CA1 or the wiring CA2 by the precharge circuit 25. The selection circuit 24 has a function of switching operations between precharging by the precharge circuit 25 and selecting the signal V1 or the signal V2 so that a period of each operation differs between the wiring CA1 and the wiring CA2.

The precharge circuit 25 has a function of outputting a precharge signal Vpri for precharging the wiring CA1 and the wiring CA2.

The output circuit 26 has a function of generating an output signal GS based on the input signal VSEL, that is, the signal V1 or the signal V2. As an example, the output circuit 26 has a configuration in which a reference signal such as a triangle wave and the signal VSEL are compared and the output signal GS is obtained.

The control signal generation circuit 27 is a circuit having a function of generating a variety of signals and reference voltages for controlling each circuit in the power supply circuit 10 in accordance with a signal output from the processor 17. In FIG. 1A, as an example, the control signal generation circuit 27 is supplied with a signal from the processor 17 through an I2C (Inter Integrated circuit) bus. Specifically, the control signal generation circuit 27 is supplied with a signal from the processor 17 through a serial data line (SDA) and a serial clock line (SCL). The control signal generation circuit 27 can generate the reference voltage VREF1 and a signal MODE in accordance with the signal input thereto. The signal MODE is a signal for switching between a voltage control mode and a current control mode by controlling the on or off of the switch 36.

In a configuration of one embodiment of the present invention, the power supply circuit 10 of one embodiment of the present invention illustrated in FIG. 1A obtains the reference voltage VREF2 in the operation of the current control mode in a configuration in which switching between the current control mode and the voltage control mode is performed. Therefore, a period for obtaining the reference voltage VREF2 can be omitted when the current control mode is switched to the voltage control mode, and control with a favorable power conversion efficiency with the same current of the load 11 as that in the current control mode is possible. Furthermore, since the reference voltage VREF2 obtained in the operation of the current control mode can be retained in the sample-and-hold circuit, a circuit that does not need to be operated can be stopped; thus, power consumption can be reduced. The correction circuit 23 can remove a high-frequency component (noise) using a digital filter; therefore, a large capacitor does not need to be provided, and the size of the power supply circuit 10 can be reduced.

Figure 1B:
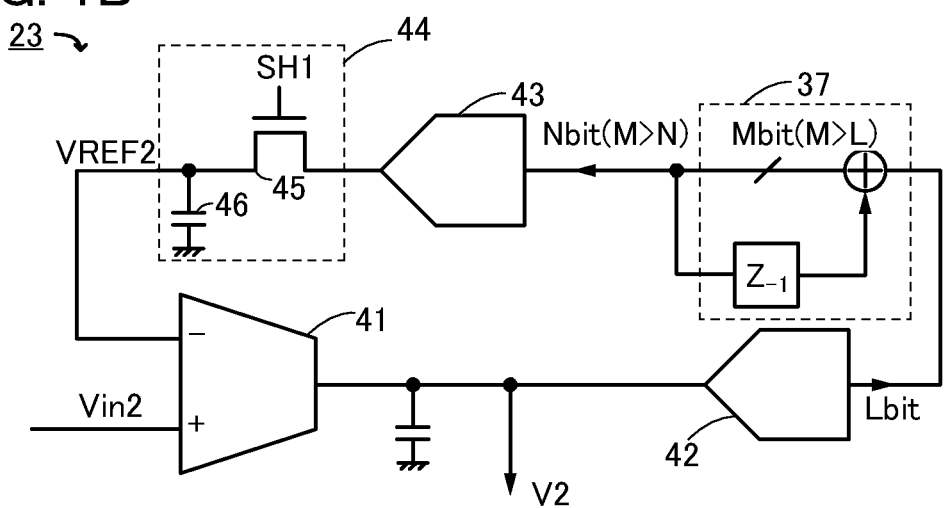

FIG. 1B is a diagram for explaining the configuration example of the correction circuit 23 illustrated in FIG. 1A. The correction circuit 23 illustrated in FIG. 1B includes a Gm amplifier 41, an analog-digital converter circuit 42, a filter circuit 37, a digital-analog converter circuit 43, and a sample-and-hold circuit 44.

The signal Vin2 and the reference voltage VREF2 are input to the Gm amplifier 41. The Gm amplifier 41 outputs current corresponding to the difference between the signal Vin2 and the reference voltage VREF2. The current output from the Gm amplifier 41 is accumulated in a parasitic capacitor or a capacitor and obtained as a voltage V2. The voltage V2 is a signal having voltage with an analog value.

The voltage V2 is input to the analog-digital converter circuit 42. The analog-digital converter circuit 42 outputs an L-bit (L is a natural number greater than or equal to 2) digital signal, for example, a 2-bit digital signal. The analog-digital converter circuit 42 is freely selected from, for example, a parallel-approximation-type A/D converter circuit, a pipeline-type A/D converter circuit, a successive-approximation-type A/D converter circuit, a delta-sigma-type A/D converter circuit, and a double-integrating-type A/D converter circuit.

The filter circuit 37 is a digital filter such as an IIR (Infinite Impulse Response) filter. The filter circuit 37 may be formed with an FIR (Finite Impulse Response) filter. The filter circuit 37 generates an M-bit (M is a natural number greater than L) digital signal, for example, a 16-bit digital signal, and outputs an N-bit (N is a natural number smaller than M) digital signal in which a low-order bit signal with a high-frequency noise component is truncated, for example, a 12-bit digital signal.

The N-bit digital signal is input to the digital-analog converter circuit 43. The digital-analog converter circuit 43 outputs the reference voltage VREF2 having a voltage value with an analog value. As the digital-analog converter circuit 43, a resistor string type can be given. A resistor string type is preferable to a capacitor ladder type because a malfunction due to extraction of charges is unlikely to be caused.

The sample-and-hold circuit 44 includes a transistor 45 and a capacitor 46. The sample-and-hold circuit 44 has a function of retaining the reference voltage VREF2. The sample-and-hold circuit 44 supplies the retained reference voltage VREF2 to the Gm amplifier 41, whereby the reference voltage VREF2 can be fed back and the voltage V2 can be corrected. The on or off of the transistor 45 is controlled by a signal SH1.

The transistor 45 is a transistor including an oxide semiconductor (OS) in a channel formation region (an OS transistor). When an OS transistor is used as the transistor included in the sample-and-hold circuit 44, the reference voltage VREF2 can be retained in the capacitor 46 connected to an input terminal of the Gm amplifier 41 utilizing an extremely low leakage current flowing between a source and a drain in an off state (hereinafter, off-state current). Therefore, power gating (a resting state) can be performed in circuits with high power consumption such as the analog-digital converter circuit 42, the filter circuit 37, and the digital-analog converter circuit 43 after obtaining the reference voltage VREF2, and the power supply circuit 10 can have low power consumption.

Note that power gating enables a shoot-through current flowing between power supply lines to be decreased by providing switches between the power supply lines and turning off the switches, whereby power consumption can be decreased. Furthermore, the structure is not limited to power gating, and power consumption may be reduced by cutting a bias current, clock gating, or decreasing voltage between power supply lines.

In addition, the sample-and-hold circuit 44 using an OS transistor can rewrite and read out analog voltages by charging and discharging of charges; thus, a substantially unlimited number of times of obtaining and reading out analog voltages is possible. The sample-and-hold circuit 44 using an OS transistor is superior in rewrite endurance because, unlike a magnetic memory or a resistive random-access memory, it does not go through atomic-level structure change. In addition, unstableness due to an increase of electron trap centers is not observed in the sample-and-hold circuit 44 using an OS transistor even when rewrite operation is repeated like in a flash memory.

Furthermore, the sample-and-hold circuit 44 using an OS transistor can freely be placed over a circuit using a Si transistor or the like, so that integration can be easy. In addition, since an OS transistor can be fabricated using manufacturing equipment similar to that for a Si transistor, the fabrication is possible at low costs.

Moreover, when an OS transistor includes a back gate electrode in addition to a gate electrode, a source electrode, and a drain electrode, the OS transistor can be a four-terminal semiconductor element. The OS transistor can be formed with an electric circuit network that can independently control input and output of signals flowing between a source and a drain depending on a voltage supplied to the gate electrode or the back gate electrode. Thus, circuit design with the same idea as that of an LSI is possible. In addition, an OS transistor has electric characteristics superior to those of a Si transistor in a high-temperature environment. Specifically, the ratio between an on-state current and an off-state current is high even at a high temperature higher than or equal to 125° C. and lower than or equal to 150° C.; thus, favorable switching operation can be performed.

Figure 2A:
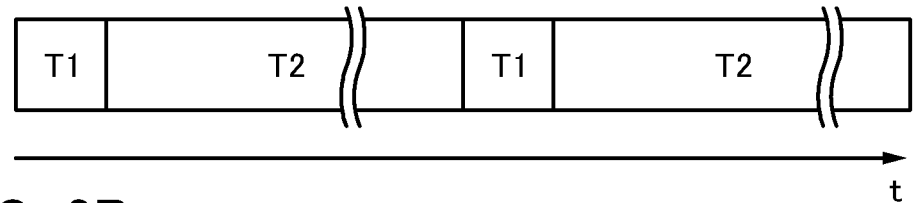
FIG. 2A, FIG. 2B, and FIG. 2C are diagrams for explaining a structure of a power supply circuit.
Figure 2B:
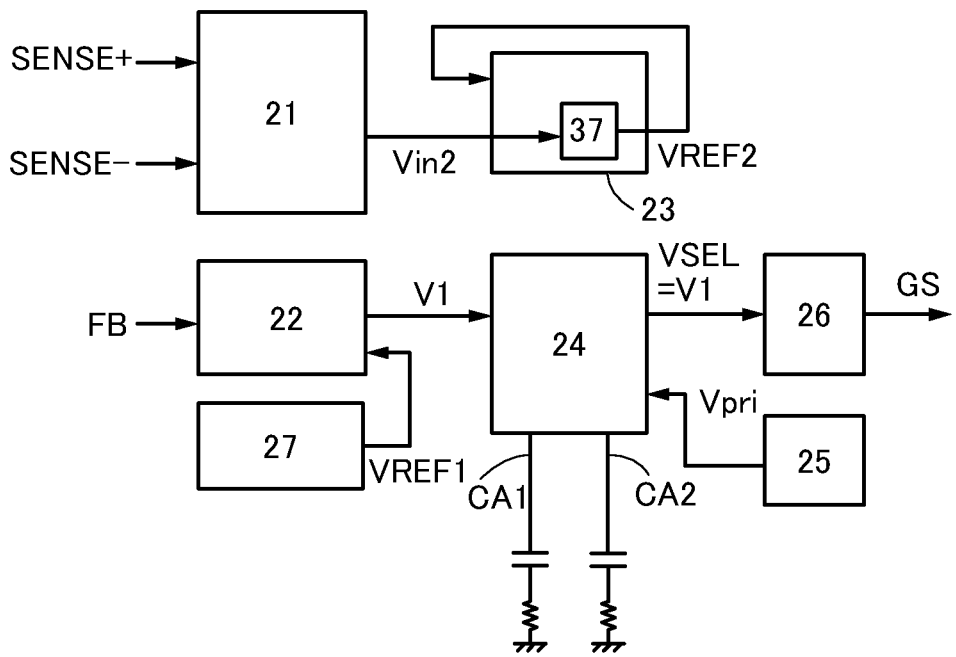
Figure 2C:
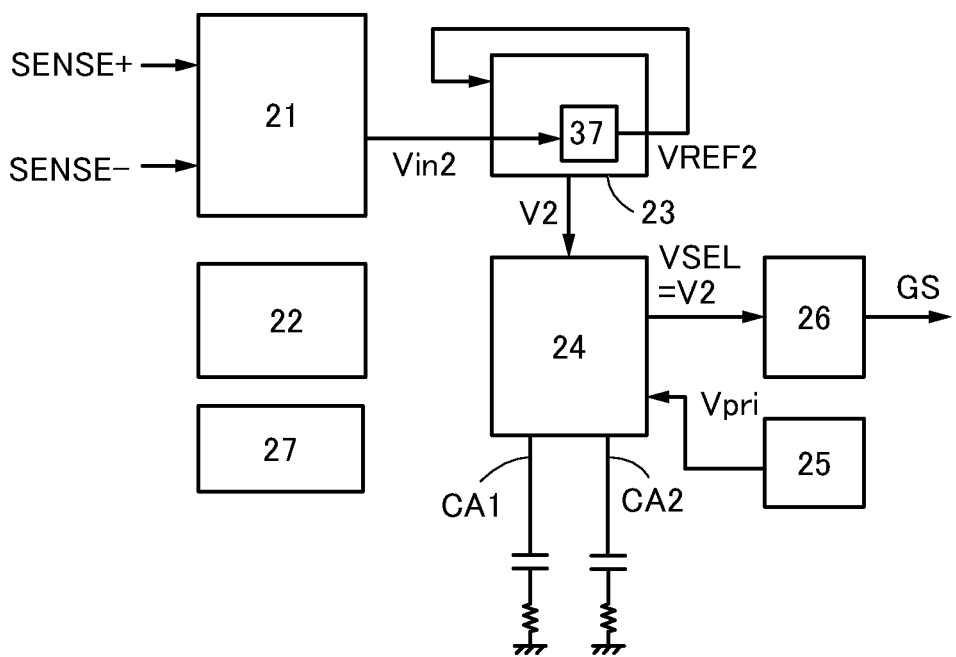

FIG. 2A to FIG. 2C are diagrams for explaining the operation of the power supply circuit illustrated in FIG. 1A. FIG. 2A illustrates a state where a period T1 corresponding to the current control mode and a period T2 corresponding to the voltage control mode are alternately switched.

FIG. 2B is a diagram for explaining the operation in the voltage control circuit 14 in the period T1. The period T1 is a period for outputting the output signal GS in accordance with the current signal. In the period T1, the reference voltage VREF1 and the signal FB are supplied to the current sensing circuit 22, and the signal V1 is generated. The selection circuit 24 selects the signal V1 retained in the wiring CA1 to supply it to the output circuit 26 as the signal VSEL and switches the change-over switch to precharge the wiring CA2 with the precharge signal Vpri.

In the period T1, the signals SENSE+ and SENSE− are supplied to the voltage sensing circuit 21 and the signal Vin2 is generated. The reference voltage VREF2 for correcting the signal V2 is generated in the correction circuit 23 by the supply of the signal Vin2. The reference voltage VREF2 can be retained in the sample-and-hold circuit.

FIG. 2C is a diagram illustrating the operation in the voltage control circuit 14 in the period T2. The period T2 is a period for outputting the output signal GS in accordance with the voltage signal. In the period T2, the signals SENSE+ and SENSE− are supplied to the voltage sensing circuit 21 and the signal Vin2 is generated. The correction circuit 23 generates the corrected signal V2 using the reference signal VREF2 that is generated and retained in the period T1. The selection circuit 24 selects the signal V2 retained in the wiring CA2 precharged in the period T1 to supply it to the output circuit 26 as the signal VSEL and switches the change-over switch to precharge the wiring CA1 with the precharge signal Vpri.

In the period T2, the input of the signal FB to the current sensing circuit 22 is stopped and power gating in each circuit included in the current sensing circuit 22 is performed, whereby the power consumption of the power supply circuit 10 can be reduced. Furthermore, in the period T2, the supply of the reference voltage VREF1 from the control signal generation circuit 27 is stopped, whereby power consumption necessary for the voltage VREF1 can be reduced.

In a configuration of one embodiment of the present invention, the reference voltage VREF2 is obtained in the operation of the current control mode in a configuration of the power supply circuit in which switching between the current control mode and the voltage control mode is performed. Therefore, when the current control mode is switched to the voltage control mode, control with a favorable power conversion efficiency with the same current of the load 11 as that in the current control mode is possible. Furthermore, since the reference voltage VREF2 obtained in the operation of the current control mode can be retained in the sample-and-hold circuit, power gating can be performed on a circuit that does not need to be operated; thus, power consumption can be reduced. Moreover, in the current control mode and the voltage control mode, the wirings retaining the signal V1 corresponding to the current signal and the signal V2 corresponding to the voltage signal are precharged in advance. Therefore, a voltage drop due to charging and discharging of the capacitor can be suppressed when the current control mode is switched to the voltage current mode.

Figure 3:
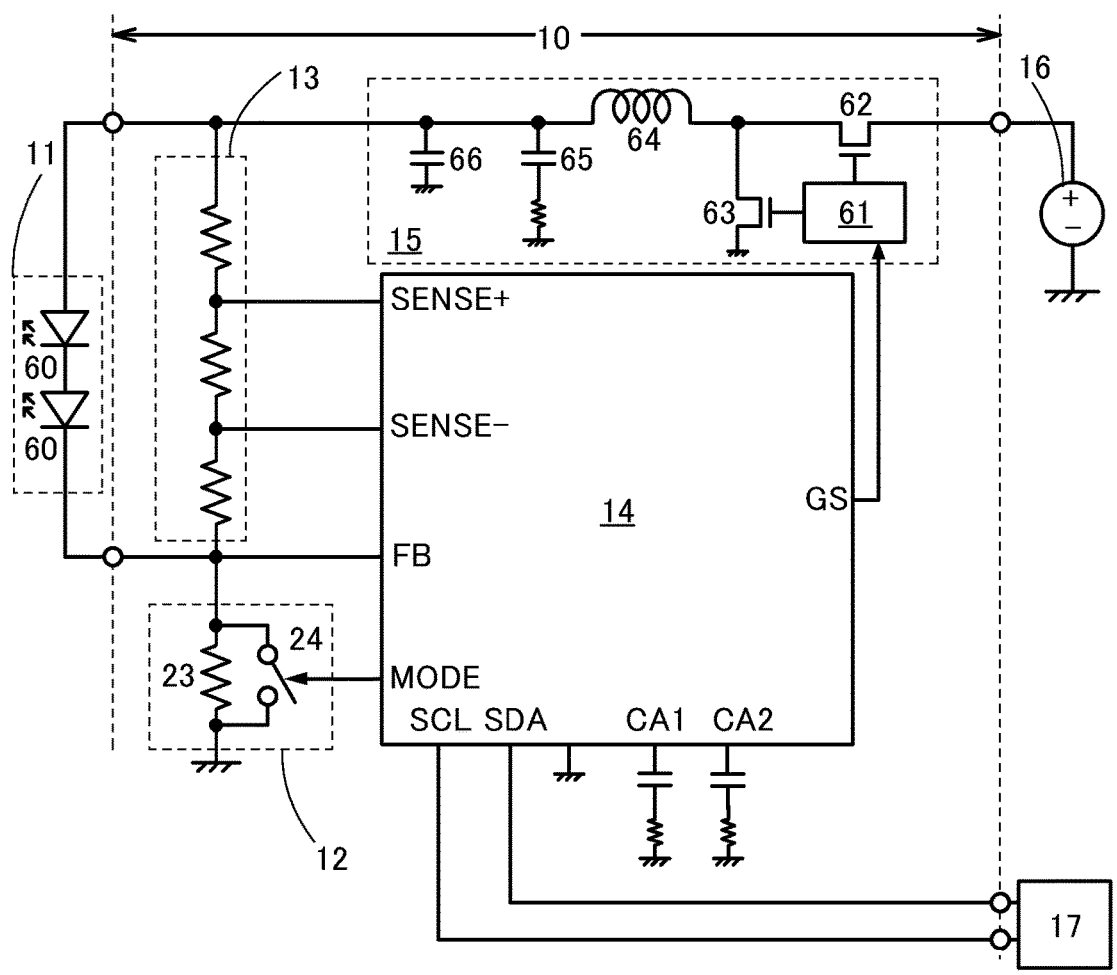
FIG. 3 is a diagram for explaining a configuration of a power supply circuit.

FIG. 3 illustrates configuration examples of the load 11 and the power converter circuit 15 that are illustrated in FIG. 1A. The voltage control circuit 14 illustrated as a detailed block diagram in FIG. 1A is illustrated as one block for simplification in FIG. 3.

FIG. 3 illustrates a configuration in which a plurality of light-emitting devices 60 are electrically connected to each other in series as an example of the load 11. As an example of the light-emitting device 60, an LED (Light Emitting Diode) or an organic electroluminescence (EL) device can be given.

FIG. 3 illustrates a configuration example of the power converter circuit 15 that has a function of dropping an input voltage. The power converter circuit 15 includes a gate driver 61, a transistor 62, a transistor 63, an inductor 64, a capacitor 65, and a capacitor 66. The gate driver 61 is supplied with the output signal GS and generates a signal for controlling the on or off of the transistor 62 and the transistor 63. The power converter circuit 15 can control voltage and current that are supplied to the light-emitting device 60, which is the load 11, by controlling the electromotive force of the inductor 64 and charging and discharging of charges accumulated in the capacitors 65 and 66 in accordance with the ratio between a period in which the transistor 62 is turned on and a period in which the transistor 63 is turned on.

Figure 4A:
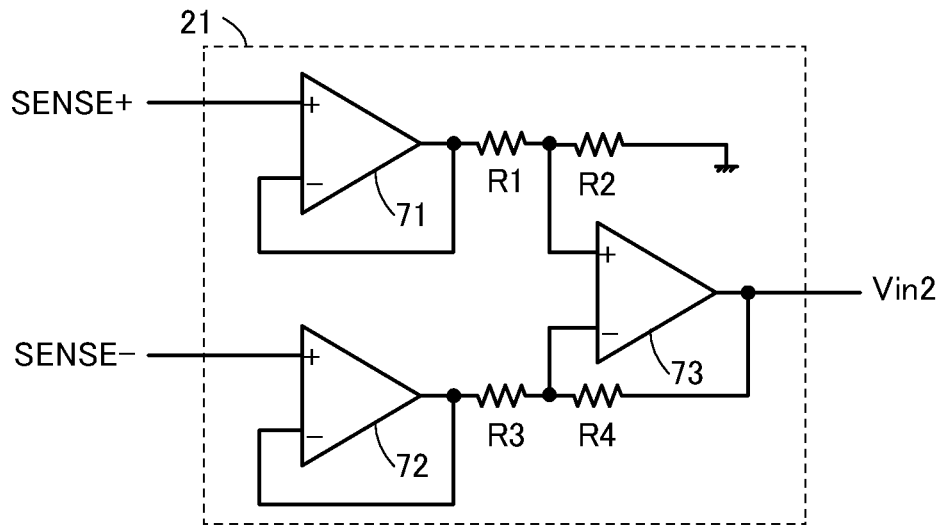
FIG. 4A and FIG. 4B are diagrams for explaining a configuration of a power supply circuit.

FIG. 4A illustrates a configuration example of the voltage sensing circuit 21 illustrated in FIG. 1A. The voltage sensing circuit 21 includes an amplifier circuit 71, an amplifier circuit 72, an amplifier circuit 73, and resistors R1 to R4. The signal SENSE+ is input to the amplifier circuit 71, and the signal SENSE− is input to the amplifier circuit 72. The amplifier circuit 73 is supplied with signals output from the amplifier circuit 71 and the amplifier circuit 72. The amplifier circuit 73 generates the signal Vin2.

Figure 4B:
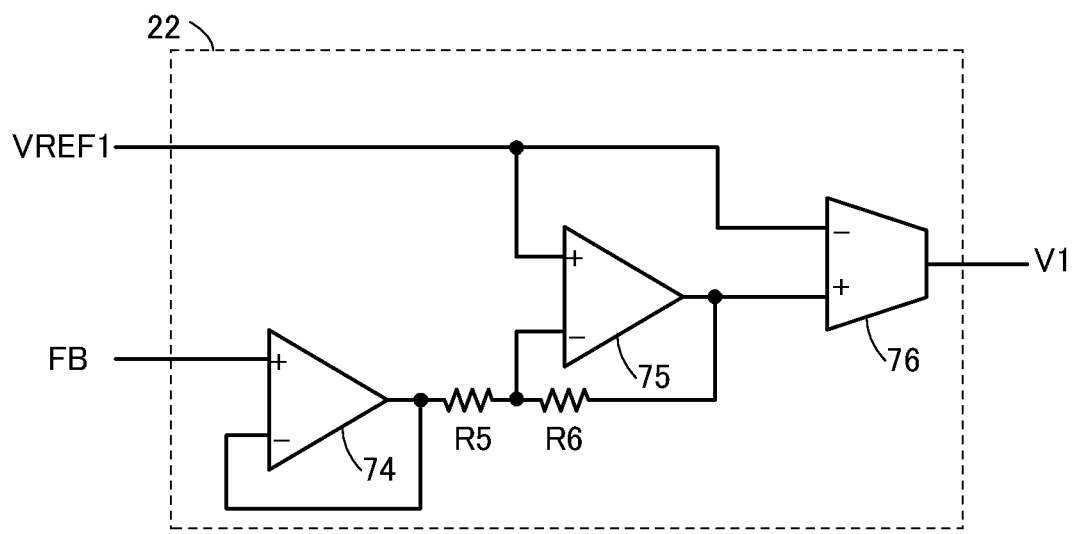

FIG. 4B illustrates a configuration example of the current sensing circuit 22 illustrated in FIG. 1A. The current sensing circuit 22 includes an amplifier circuit 74, an amplifier circuit 75, a Gm amplifier 76, and resistors R5 and R6. The signal FB is input to the amplifier circuit 74. The reference voltage VREF1 and a signal output from the amplifier circuit 74 are supplied to the amplifier circuit 75. The reference voltage VREF1 and a signal output from the amplifier circuit 75 are supplied to the Gm amplifier 76. The Gm amplifier 76 generates the signal V1.

Figure 5:
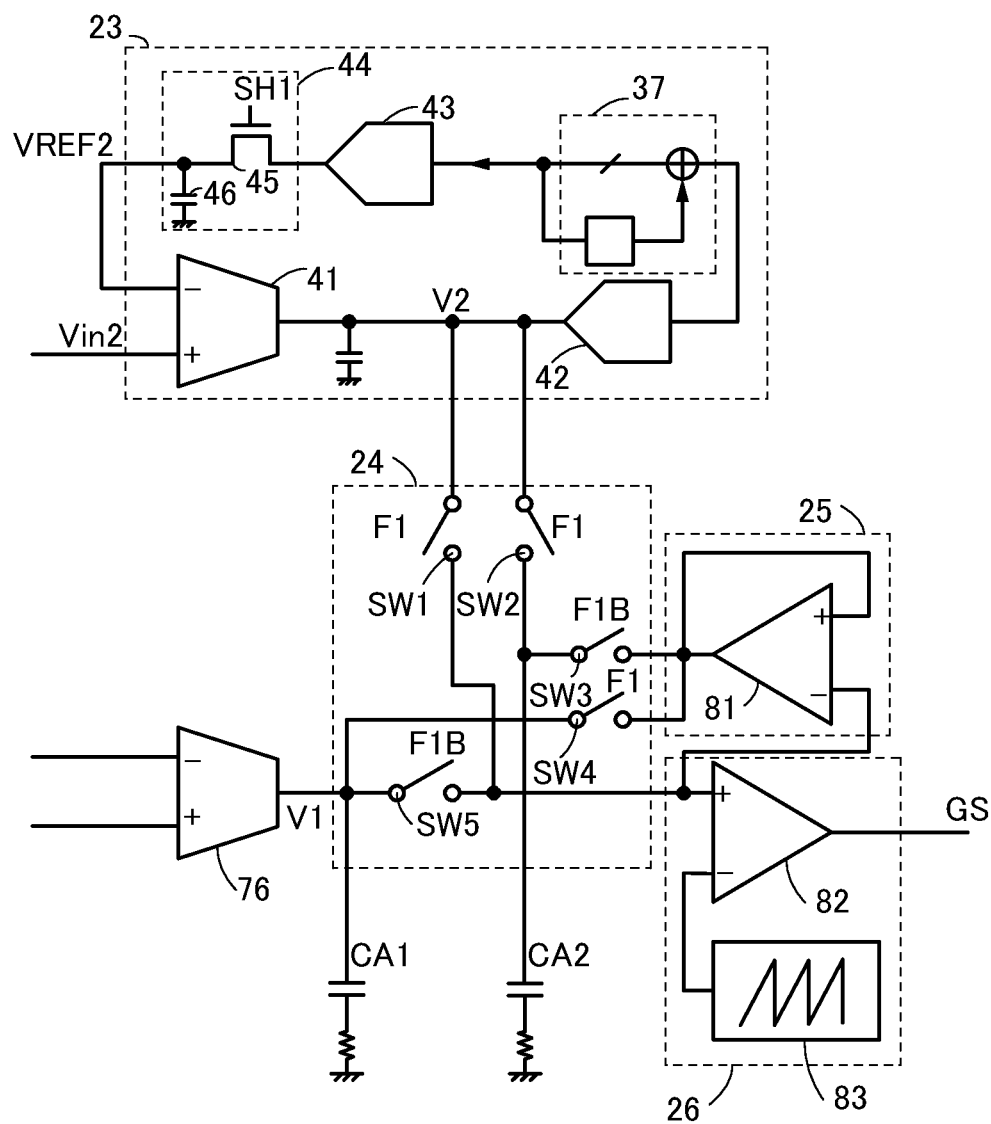
FIG. 5 is a diagram for explaining a configuration of a power supply circuit.

FIG. 5 illustrates configuration examples of the correction circuit 23, the selection circuit 24, the precharge circuit 25, and the output circuit 26, which are illustrated in FIG. 1A. Note that the correction circuit 23 is similar to that illustrated in FIG. 1B.

The selection circuit 24 includes change-over switches SW1 to SW5 as illustrated in FIG. 5. Note that the change-over switch may be simply referred to as a switch. The change-over switches SW1 to SW5 can be formed with a transistor and the like. As illustrated in FIG. 5, the change-over switches SW1 to SW5 are each supplied with a switching signal F1 or a switching signal F1B, and the on or off of the change-over switches SW1 to SW5 is controlled. The switching signal F1B is an inverted signal of the switching signal F1.

The precharge circuit 25 includes an amplifier circuit 81. The precharge circuit 25 has a function of precharging the wiring CA1 or precharging the wiring CA2 in accordance with the switching of the selection circuit 24.

The output circuit 26 includes an amplifier circuit 82 and a triangle wave generation circuit 83. The output circuit 26 outputs the signal GS in accordance with the magnitude relation between a triangle wave output from the triangle wave generation circuit 83 and the signal V1 or the signal V2 that is selected by the selection circuit 24. The triangular wave may be a sawtooth wave.

Operation of the correction circuit 23, the selection circuit 24, the precharge circuit 25, and the output circuit 26 in FIG. 5 in the period T1 illustrated in FIG. 2A will be described with reference to FIG. 6A. Note that in FIG. 6A, a signal flow is shown by a bold dashed line.

Figure 6A:
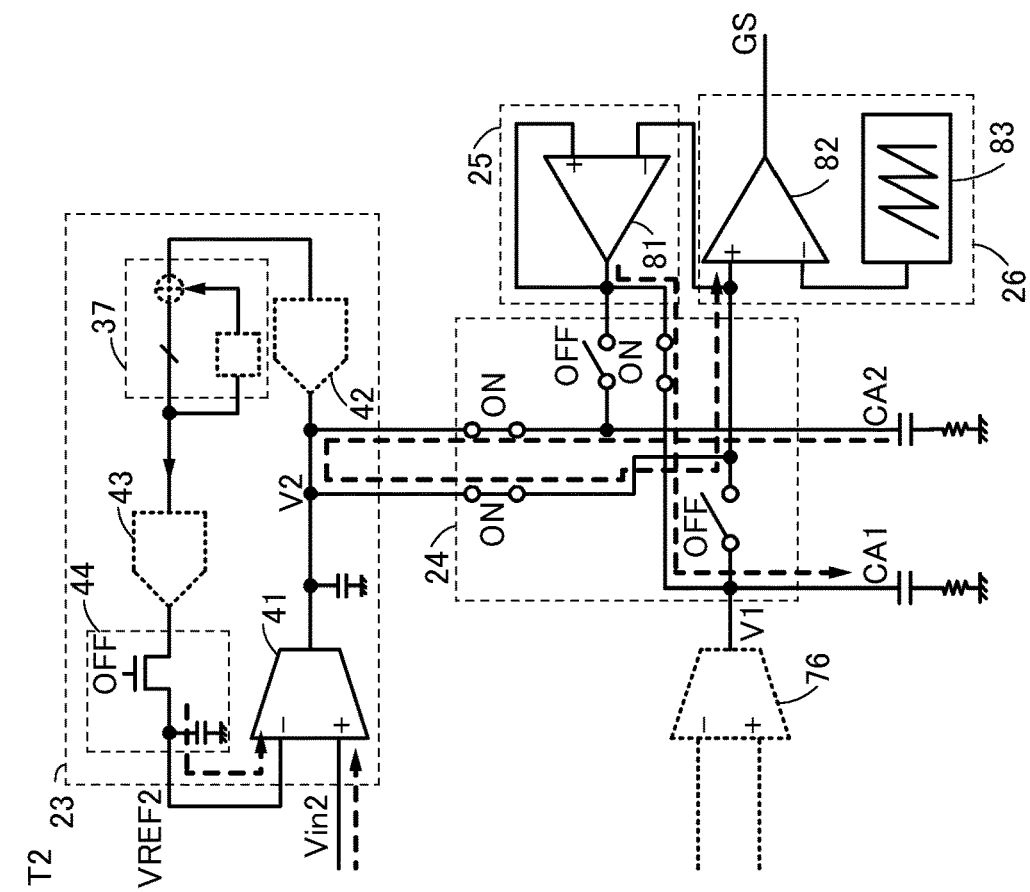
FIG. 6A and FIG. 6B are diagrams for explaining a configuration of a power supply circuit.

In the period T1, as illustrated in FIG. 6A, the change-over switches are switched by the switching signals F1 and F1B so that the change-over switches SW3 and SW5 are turned on and SW1, SW2, and SW4 are turned off. The wiring CA2 and the capacitor connected to the wiring CA2 are precharged by the precharge signal Vpri. The wiring CA1 and the capacitor connected to a wiring C1 are supplied with the signal V1, and the signal V1 is supplied to an input terminal of the amplifier circuit 82 as the signal VSEL.

Furthermore, in the period T1, the signal Vin2 is supplied to an input terminal of the Gm amplifier 41 of the correction circuit 23 as illustrated in FIG. 6A. The signal V2 obtained by an output current from the Gm amplifier 41 is supplied to the sample-and-hold circuit 44 as the reference voltage VREF2 through the analog-digital converter circuit 42, the filter circuit 37, and the digital-analog converter circuit 43 in the correction circuit 23. The transistor 45 is turned on. The reference voltage VREF2 is supplied to the input terminal of the Gm amplifier 41. When the transistor 45 is turned off, the correction circuit 23 can retain the reference voltage VREF2.

Operation of the correction circuit 23, the selection circuit 24, the precharge circuit 25, and the output circuit 26 in FIG. 5 in the period T2 illustrated in FIG. 2A will be described with reference to FIG. 6B. Note that in FIG. 6B, a signal flow is shown by a bold dashed line as in FIG. 6A. Furthermore, in FIG. 6B, a circuit capable of power gating is shown by a thin dashed line.

Figure 6B:
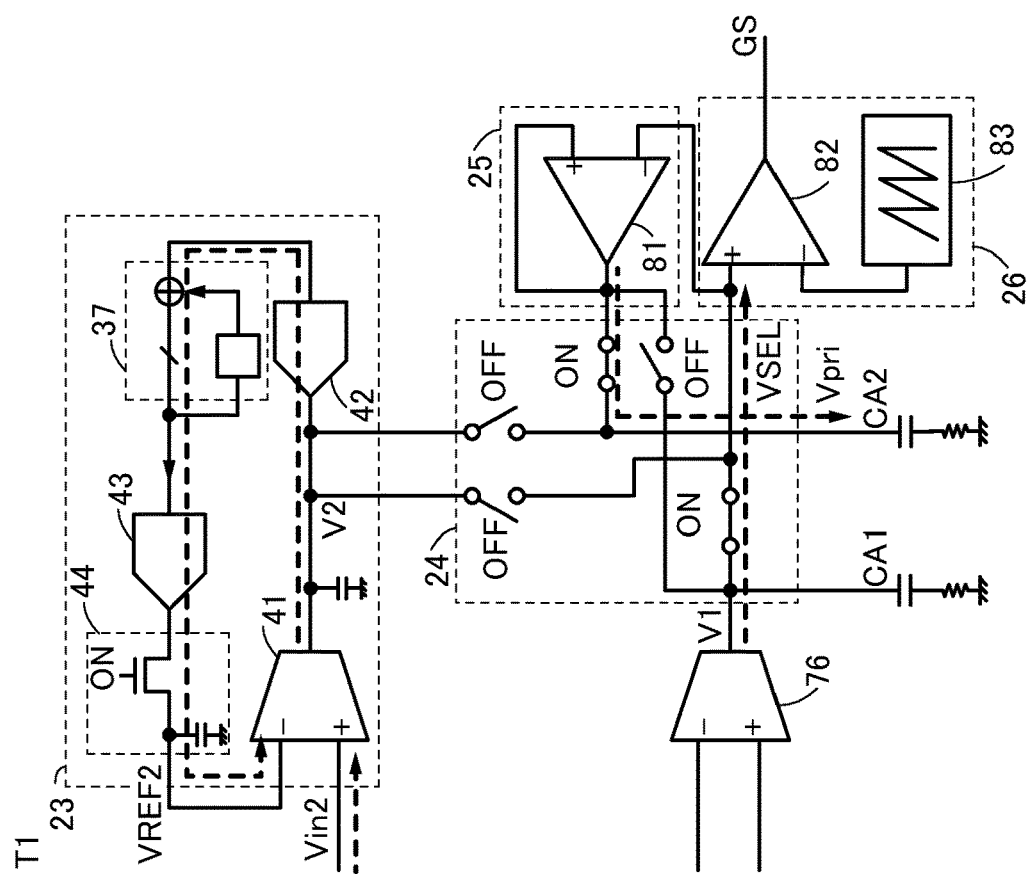

In the period T2, as illustrated in FIG. 6B, the change-over switches are switched by the switching signals F11 and F1B so that the change-over switches SW3 and SW5 are turned off and SW1, SW2, and SW4 are turned on. The wiring CA1 and the capacitor connected to the wiring CA1 are precharged by the precharge signal Vpri. The wiring CA2 and the capacitor connected to the wiring CA2 are supplied with the signal V2, and the signal V2 is supplied to the input terminal of the amplifier circuit 82 as the signal VSEL. The wiring CA2 and the capacitor connected to the wiring CA2 are precharged in advance in the period T1. Thus, potential supplied to the amplifier circuit 82 can be gradually changed.

Furthermore, in the period T2, the transistor 45 in the correction circuit 23 is turned off as illustrated in FIG. 6B. Since the sample-and-hold circuit 44 can keep retaining the reference voltage VREF2, power gating can be performed on the analog-digital converter circuit 42, the filter circuit 37, and the digital-analog converter circuit 43 in the correction circuit 23. In addition, in the period T2, power gating can be performed also on the Gm amplifier 76 included in the current sensing circuit 22.

A configuration example of the control signal generation circuit 27 illustrated in FIG. 1A will be described with reference to FIG. 7A. The control signal generation circuit 27 includes an interface circuit 91, a digital-analog converter circuit 92, an inverter circuit 93, and a buffer circuit 94.

The interface circuit 91 functions as an I2C interface circuit. The interface circuit 91 is supplied with the signal from the processor 17 through the serial data line (SDA) and the serial clock line (SCL). In accordance with the control of the signal, the interface circuit 91 generates signals for outputting to each circuit of the digital-analog converter circuit 92, the inverter circuit 93, and the buffer circuit 94 and a signal STBY. The signal STBY is a signal for controlling power gating in the power supply circuit 10, the signal SH1, and the like.

The digital-analog converter circuit 92 has a function of generating the reference voltage VREF1 that is set on the basis of the signal supplied from the processor 17.

The switching signals F1 and F1B are the signals for controlling the change-over switches in the selection circuit 24. The control signal generation circuit 27 generates the switching signal F1 and outputs the switching signal F1 through the inverter circuit 93, whereby the switching signal F1B in which a logic is inverted is obtained. The control signal generation circuit 27 generates the signal MODE. The signal MODE has the same logic as the switching signal F1.

The signal MODE is the signal for switching between the voltage control mode and the current control mode by controlling the on or off of the switch 36. FIG. 7B illustrates the relation between the signal MODE and the switching between the period T1 and the period T2 illustrated in FIG. 2A. The signal MODE turns on the switch 36 at an H level and turns off the switch 36 at an L level. As illustrated in FIG. 7B, in the period T1, the signal MODE is at the L level, that is, performs the current control mode. Furthermore, in the period T2, the signal MODE is at the H level, that is, performs the voltage control mode.

Figure 7A:
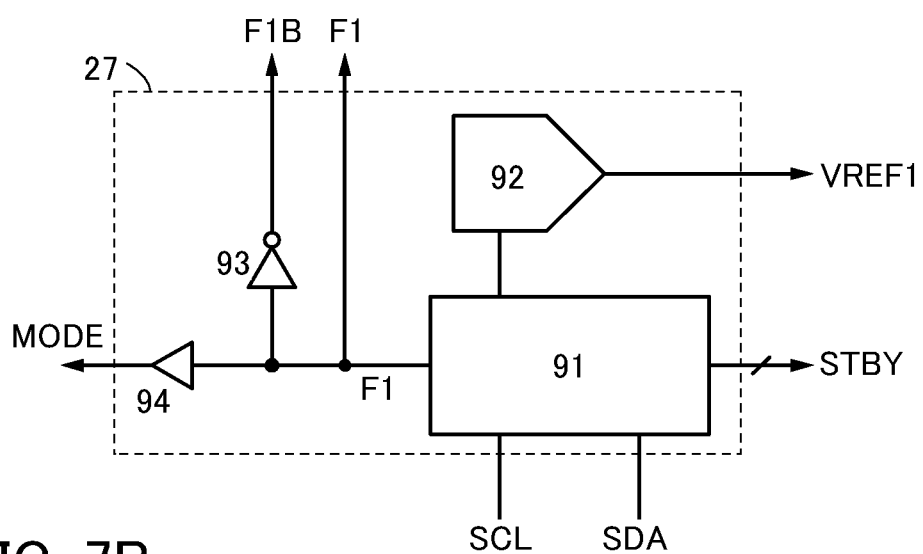
FIG. 7A and FIG. 7B are diagrams for explaining a structure of a power supply circuit.
Figure 7B:
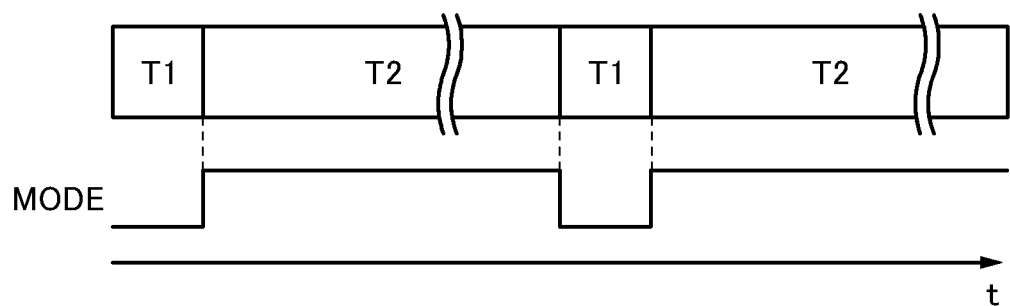

As for the configuration example of the control signal generation circuit 27 illustrated in FIG. 7A, another configuration may be used. For example, FIG. 8A illustrates a control signal generation circuit 27A with a configuration different from that of the control signal generation circuit 27 illustrated in FIG. 7A.

Figure 8A:
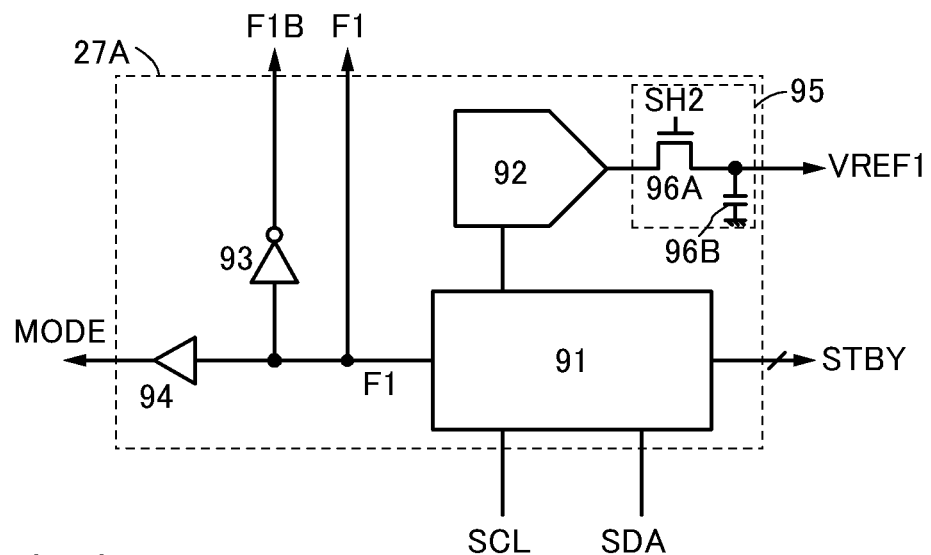
FIG. 8A and FIG. 8B are diagrams for explaining a configuration of a power supply circuit.

FIG. 8A is different from FIG. 7A in that a sample-and-hold circuit 95 is included at an output terminal of the digital-analog converter circuit 92. The sample-and-hold circuit 95 includes a transistor 96A and a capacitor 96B.

Figure 8B:
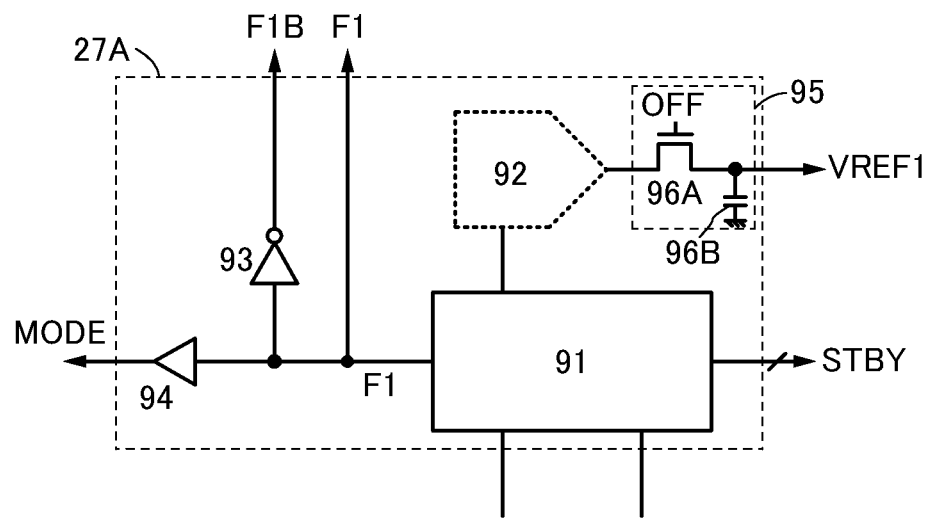

After the digital-analog converter circuit outputs VREF1, the reference voltage VREF1 can be retained in the capacitor 96B by turning off the transistor 96A with the control of a signal SH2. In FIG. 8B, a circuit capable of power gating is shown by a thin dashed line as in FIG. 6B. As illustrated in FIG. 8B, when the reference voltage VREF1 is retained in the sample-and-hold circuit 95, power gating can be performed on the digital-analog converter circuit 92; thus, power consumption can be reduced.

Figure 9:
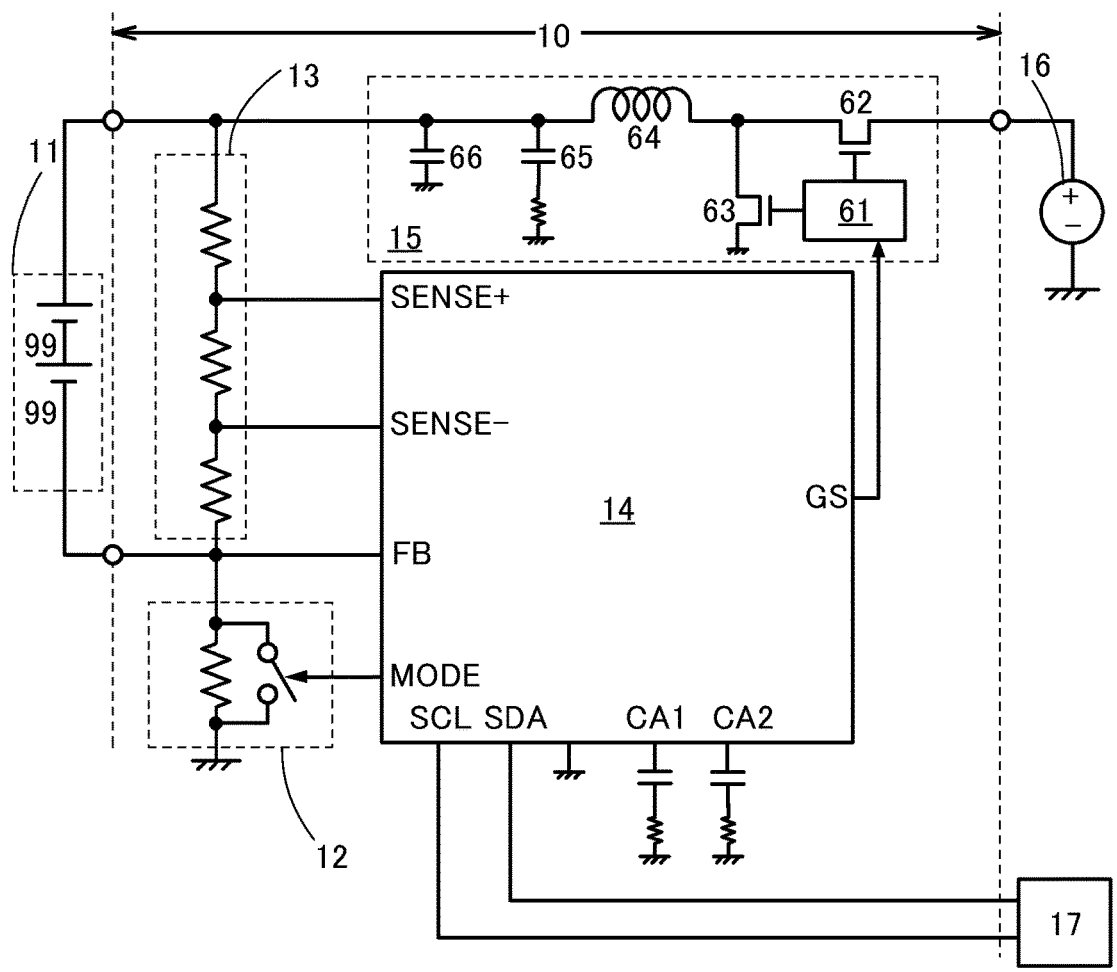
FIG. 9 is a diagram for explaining a configuration of a power supply circuit.

Although the light-emitting device 60 is given as the load 11 in FIG. 3, another structure may be employed. FIG. 9 illustrates a configuration in which a plurality of batteries 99 are electrically connected to each other in series, as an example of the load 11. As an example of the battery 99 (also referred to as a secondary battery), a lithium ion secondary battery such as a lithium polymer battery using a gel electrolyte (lithium ion polymer battery), a nickel-hydride battery, a nickel-cadmium battery, an organic radical battery, a lead storage battery, an air secondary battery, a nickel-zinc battery, and a silver-zinc battery can be given. The other components in FIG. 9 are similar to those in FIG. 3.

Figure 10A:
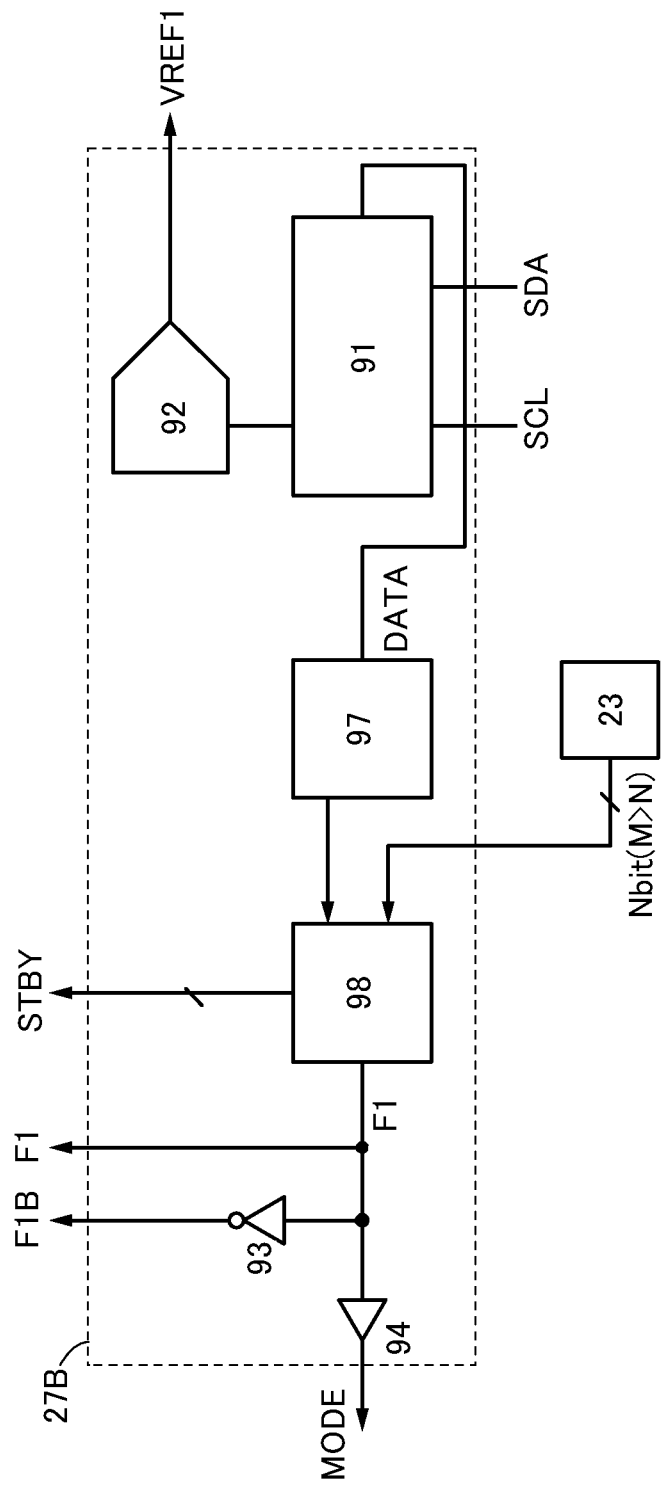
FIG. 10A and FIG. 10B are diagrams for explaining a structure of a power supply circuit.

FIG. 10A illustrates an example of a control signal generation circuit 27B included in the voltage control circuit 14 in FIG. 9. The control signal generation circuit 27B includes the interface circuit 91, the digital-analog converter circuit 92, the inverter circuit 93, the buffer circuit 94, a register 97, and a comparator 98. The description of the interface circuit 91, the digital-analog converter circuit 92, the inverter circuit 93, and the buffer circuit 94 is similar to that in FIG. 7A; thus, the description is omitted.

The register 97 has a function of retaining a signal DATA supplied from the processor 17. The comparator 98 is supplied with the N-bit digital signal input to a digital-analog signal of the correction circuit 23 and the signal DATA retained in the register 97. The comparator 98 outputs a signal based on the comparison result as the switching signal F1.

Figure 10B:
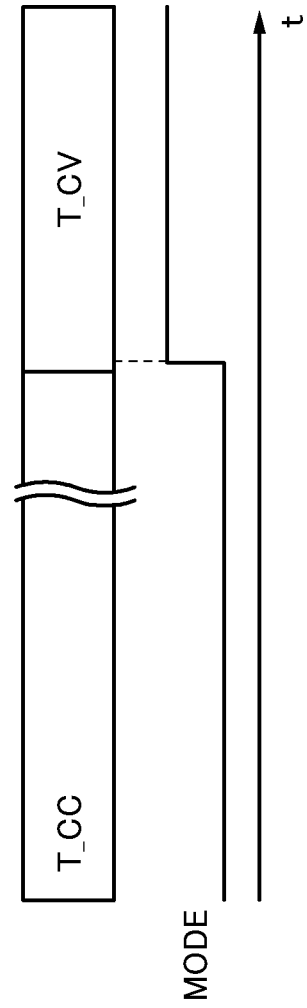

The signal MODE is a signal for switching between constant current (hereinafter, CC) charging and constant voltage (hereinafter, CV) charging by controlling the on or off of the switch 36. In FIG. 2A, the period T1 corresponds to a period for performing CC charging, and the period T2 corresponds to a period for performing CV charging. FIG. 10B illustrates the relation between the signal MODE and the switching between a period T_CC for performing CC charging and a period T_CV for performing CV charging. The signal MODE turns on the switch 36 at the H level and turns off the switch 36 at the L level. As illustrated in FIG. 10B, in the period T_CC, the signal MODE is at the L level, that is, performs CC charging. Furthermore, in the period T_CV, the signal MODE is at the H level, that is, performs CV charging.

The above-described semiconductor device of one embodiment of the present invention obtains the reference voltage VREF2 in the operation of CC charging in the configuration of the power supply circuit in which switching between CC charging and CV charging is performed. Therefore, the reference voltage VREF2 with less influence of noise is obtained when CC charging is switched to CV charging; thus, higher-accuracy CV charging is possible. Furthermore, since the reference voltage VREF2 obtained in the operation of CC charging can be retained in the sample-and-hold circuit, power gating can be performed on a circuit that does not need to be operated; thus, power consumption can be reduced. Moreover, the wirings retaining the signal V1 corresponding to the current signal and the signal V2 corresponding to the voltage signal are precharged by CC charging and CV charging in advance. Therefore, a voltage drop due to charging and discharging of the capacitor can be suppressed when CC charging is switched to CV charging.

Embodiment 2

In this embodiment, a structure of a transistor applicable to the semiconductor device including the power supply circuit 10 described in the above embodiment, specifically, a structure in which transistors having different electrical characteristics are stacked will be described. In particular, in this embodiment, a structure of each transistor included in a power supply circuit of a semiconductor device will be described. With the structure, the degree of flexibility in design of the semiconductor device can be increased. Furthermore, when transistors having different electrical characteristics are stacked, the integration degree of the semiconductor device can be increased.

Figure 11:
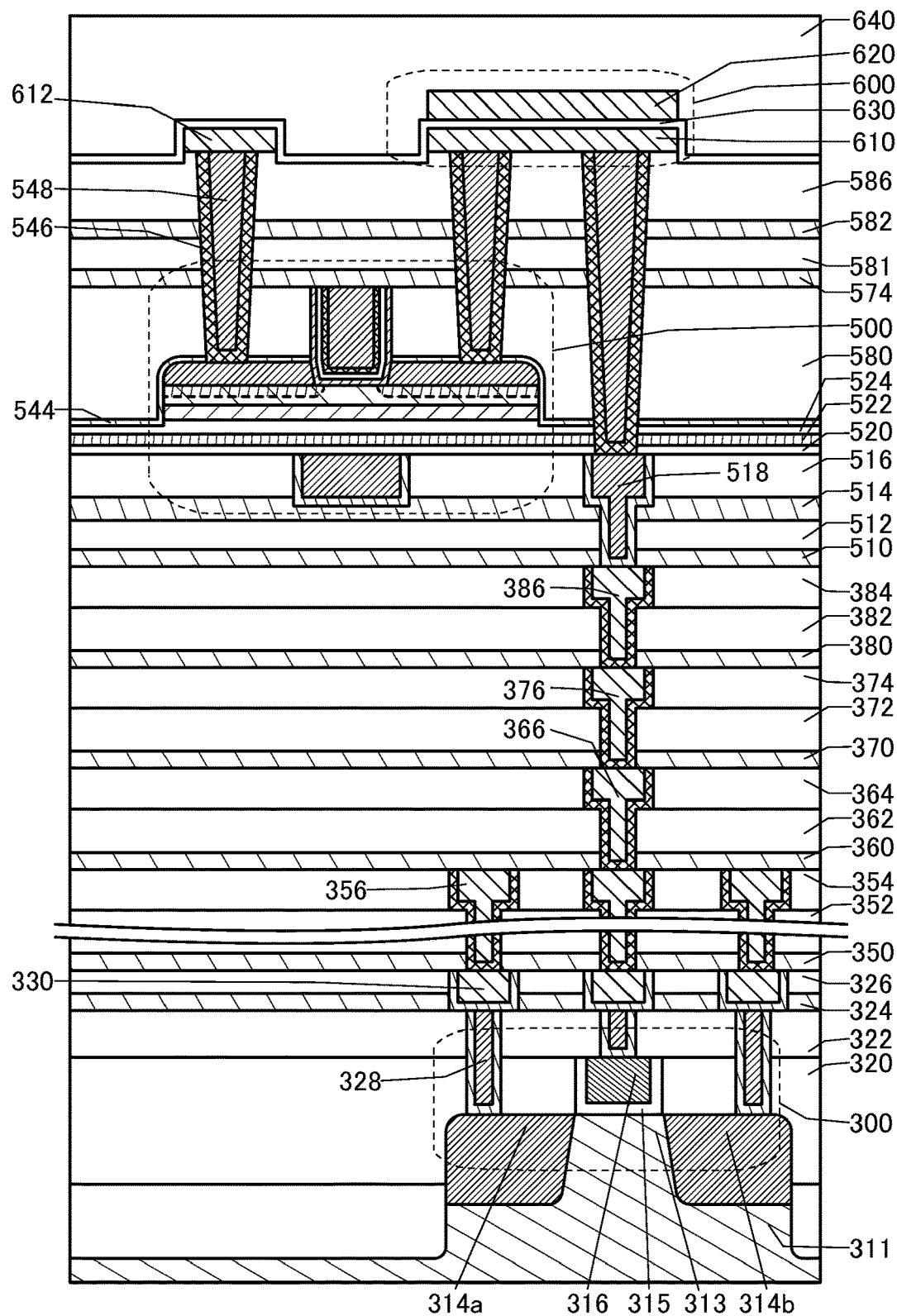
FIG. 11 is a schematic cross-sectional view illustrating a structure of a semiconductor device.
Figure 13A:
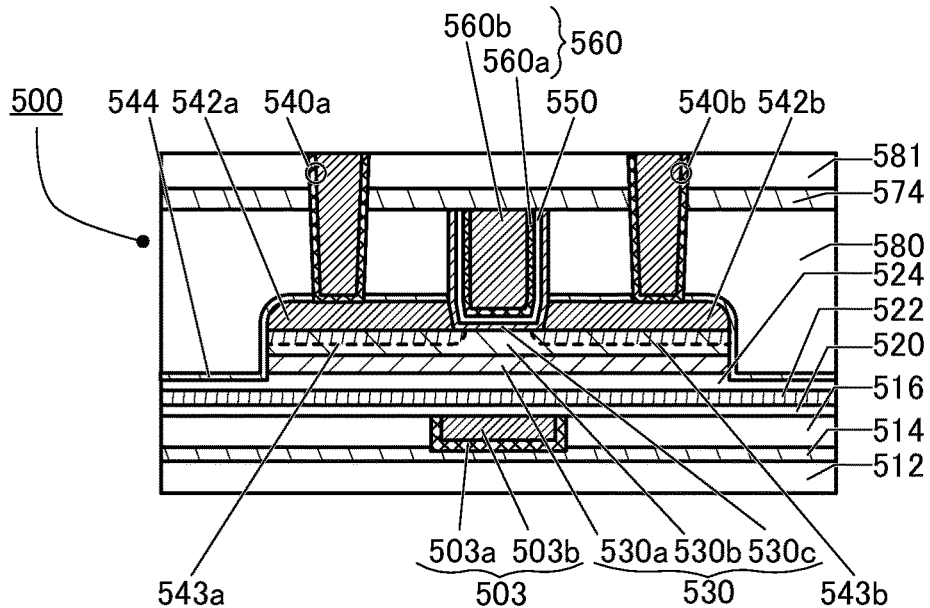
FIG. 13A, FIG. 13B, and FIG. 13C are schematic cross-sectional views illustrating a structure of a semiconductor device.
Figure 13B:
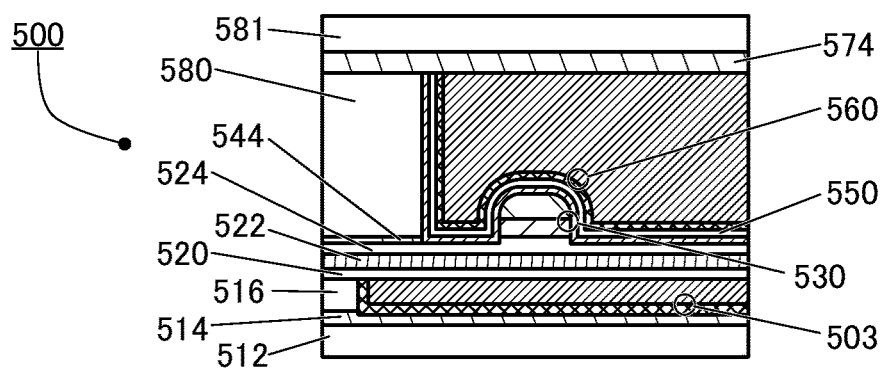
Figure 13C:
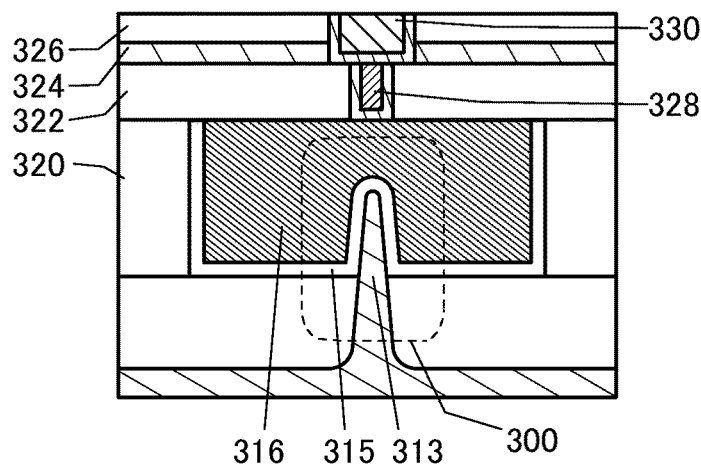

A semiconductor device illustrated in FIG. 11 includes a transistor 300, a transistor 500, and a capacitor 600. FIG. 13A is a cross-sectional view of the transistor 500 in the channel length direction, FIG. 13B is a cross-sectional view of the transistor 500 in the channel width direction, and FIG. 13C is a cross-sectional view of the transistor 300 in the channel width direction.

The transistor 500 is a transistor including a metal oxide in a channel formation region (an OS transistor). Since the off-state current of the transistor 500 is low, when the transistor 500 is used as a transistor included in a semiconductor device, written data voltage or charge can be retained for a long time. In other words, the frequency of refresh operation is low or refresh operation is not required; thus, the power consumption of the semiconductor device can be reduced.

The semiconductor device described in this embodiment includes the transistor 300, the transistor 500, and the capacitor 600, as illustrated in FIG. 11. The transistor 500 is provided above the transistor 300, and the capacitor 600 is provided above the transistor 300 and the transistor 500. Note that the capacitor 600 can be used as a capacitor Cs or the like in a memory circuit MC.

The transistor 300 is provided over a substrate 311 and includes a conductor 316, an insulator 315, a semiconductor region 313 that is a part of the substrate 311, and a low-resistance region 314a and a low-resistance region 314b functioning as a source region and a drain region. For example, the transistor 300 can be used as a transistor or the like included in the digital-analog converter circuit 43 in the above embodiment.

In the transistor 300, a top surface and a side surface in the channel width direction of the semiconductor region 313 are covered with the conductor 316 with the insulator 315 therebetween, as illustrated in FIG. 13C. Such a Fin-type transistor 300 can have an increased effective channel width, and thus have improved on-state characteristics. In addition, since contribution of an electric field of a gate electrode can be increased, the off-state characteristics of the transistor 300 can be improved.

Note that the transistor 300 can be either a p-channel transistor or an n-channel transistor.

A region of the semiconductor region 313 where a channel is formed, a region in the vicinity thereof, the low-resistance region 314a and the low-resistance region 314b functioning as the source region and the drain region, and the like preferably contain a semiconductor such as a silicon-based semiconductor, further preferably contain single crystal silicon. Alternatively, the regions may be formed using a material containing Ge (germanium), SiGe (silicon germanium), GaAs (gallium arsenide), GaAlAs (gallium aluminum arsenide), or the like. Silicon whose effective mass is adjusted by applying stress to the crystal lattice and thereby changing the lattice spacing may be used. Alternatively, the transistor 300 may be an HEMT (High Electron Mobility Transistor) with the use of GaAs and GaAlAs, or the like.

The low-resistance region 314a and the low-resistance region 314b contain an element that imparts n-type conductivity, such as arsenic or phosphorus, or an element that imparts p-type conductivity, such as boron, in addition to a semiconductor material used for the semiconductor region 313.

The conductor 316 functioning as a gate electrode can be formed using a semiconductor material such as silicon containing an element that imparts n-type conductivity, such as arsenic or phosphorus, or an element that imparts p-type conductivity, such as boron, or a conductive material such as a metal material, an alloy material, or a metal oxide material.

Note that the work function depends on a material used for a conductor; therefore, selecting the material for the conductor can adjust the threshold voltage of the transistor. Specifically, it is preferable to use a material such as titanium nitride or tantalum nitride for the conductor. Moreover, in order to ensure both conductivity and embeddability, it is preferable to use stacked layers of metal materials such as tungsten and aluminum for the conductor, and it is particularly preferable to use tungsten in terms of heat resistance.

Figure 12:
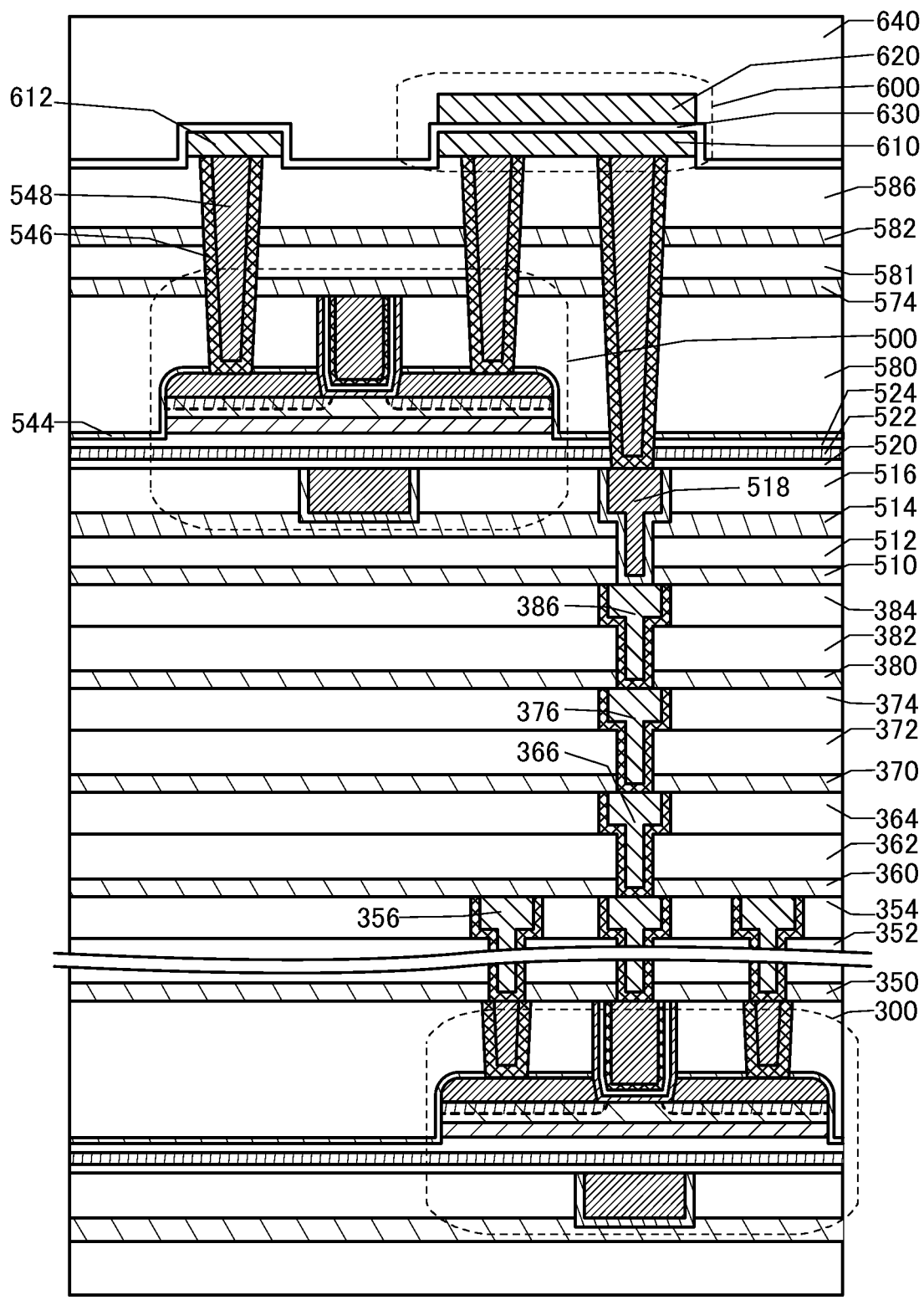
FIG. 12 is a schematic cross-sectional view illustrating a structure of a semiconductor device.

Note that the transistor 300 illustrated in FIG. 11 is an example and the structure is not limited thereto; an appropriate transistor can be used in accordance with a circuit configuration or a driving method. For example, when the semiconductor device is a single-polarity circuit using only OS transistors (which represent a circuit including transistors having the same polarity, e.g., only n-channel transistors), the transistor 300 has a structure similar to that of the transistor 500 using an oxide semiconductor, as illustrated in FIG. 12. Note that the details of the transistor 500 are described later.

An insulator 320, an insulator 322, an insulator 324, and an insulator 326 are stacked in this order to cover the transistor 300.

For the insulator 320, the insulator 322, the insulator 324, and the insulator 326, silicon oxide, silicon oxynitride, silicon nitride oxide, silicon nitride, aluminum oxide, aluminum oxynitride, aluminum nitride oxide, aluminum nitride, or the like is used, for example.

Note that in this specification, silicon oxynitride refers to a material that has a higher oxygen content than a nitrogen content, and silicon nitride oxide refers to a material that has a higher nitrogen content than an oxygen content. Moreover, in this specification, aluminum oxynitride refers to a material that has a higher oxygen content than a nitrogen content, and aluminum nitride oxide refers to a material that has a higher nitrogen content than an oxygen content.

The insulator 322 may have a function of a planarization film for planarizing a level difference caused by the transistor 300 or the like provided below the insulator 322. For example, a top surface of the insulator 322 may be planarized by planarization treatment using a chemical mechanical polishing (CMP) method or the like to improve planarity.

In addition, for the insulator 324, it is preferable to use a film having a barrier property that prevents diffusion of hydrogen or impurities from the substrate 311, the transistor 300, or the like into a region where the transistor 500 is provided.

For the film having a barrier property against hydrogen, silicon nitride formed by a CVD method can be used, for example. Here, diffusion of hydrogen into a semiconductor element including an oxide semiconductor, such as the transistor 500, degrades the characteristics of the semiconductor element in some cases. Therefore, a film that inhibits hydrogen diffusion is preferably used between the transistor 500 and the transistor 300. The film that inhibits hydrogen diffusion is specifically a film from which a small amount of hydrogen is released.

The amount of released hydrogen can be analyzed by thermal desorption spectroscopy (TDS) or the like, for example. The amount of hydrogen released from the insulator 324 that is converted into hydrogen atoms per area of the insulator 324 is less than or equal to $10 \times 10^{15}$ atoms/cm$^2$, preferably less than or equal to $5 \times 10^{15}$ atoms/cm$^2$, in the TDS analysis in a film-surface temperature range of 50° C. to 500° C., for example.

Note that the permittivity of the insulator 326 is preferably lower than that of the insulator 324. For example, the relative permittivity of the insulator 326 is preferably lower than 4, further preferably lower than 3. The relative permittivity of the insulator 326 is, for example, preferably 0.7 times or less, further preferably 0.6 times or less the relative permittivity of the insulator 324. When a material with a low permittivity is used as an interlayer film, the parasitic capacitance generated between wirings can be reduced.

In addition, a conductor 328, a conductor 330, and the like that are connected to the capacitor 600 or the transistor 500 are embedded in the insulator 320, the insulator 322, the insulator 324, and the insulator 326. Note that the conductor 328 and the conductor 330 have a function of a plug or a wiring. A plurality of conductors having a function of a plug or a wiring are collectively denoted by the same reference numeral in some cases. Moreover, in this specification and the like, a wiring and a plug connected to the wiring may be a single component. That is, in some cases, part of a conductor functions as a wiring or part of a conductor functions as a plug.

As a material for each of the plugs and wirings (the conductor 328, the conductor 330, and the like), a single layer or a stacked layer of a conductive material such as a metal material, an alloy material, a metal nitride material, or a metal oxide material can be used. It is preferable to use a high-melting-point material that has both heat resistance and conductivity, such as tungsten or molybdenum, and it is particularly preferable to use tungsten. Alternatively, a low-resistance conductive material such as aluminum or copper is preferably used. The use of a low-resistance conductive material can reduce wiring resistance.

A wiring layer may be provided over the insulator 326 and the conductor 330. For example, in FIG. 11, an insulator 350, an insulator 352, and an insulator 354 are stacked in this order. Furthermore, a conductor 356 is formed in the insulator 350, the insulator 352, and the insulator 354. The conductor 356 has a function of a plug or a wiring that is connected to the transistor 300. Note that the conductor 356 can be provided using a material similar to those for the conductor 328 and the conductor 330.

Note that for example, an insulator having a barrier property against hydrogen is preferably used as the insulator 350, like the insulator 324. Furthermore, the conductor 356 preferably contains a conductor having a barrier property against hydrogen. In particular, the conductor having a barrier property against hydrogen is formed in an opening of the insulator 350 having a barrier property against hydrogen. With the structure, the transistor 300 and the transistor 500 can be separated by a barrier layer, so that diffusion of hydrogen from the transistor 300 into the transistor 500 can be inhibited.

Note that for the conductor having a barrier property against hydrogen, tantalum nitride is preferably used, for example. Stacking tantalum nitride and tungsten having high conductivity can inhibit diffusion of hydrogen from the transistor 300 while the conductivity of a wiring is ensured. In that case, the tantalum nitride layer having a barrier property against hydrogen is preferably in contact with the insulator 350 having a barrier property against hydrogen.

A wiring layer may be provided over the insulator 354 and the conductor 356. For example, in FIG. 11, an insulator 360, an insulator 362, and an insulator 364 are stacked in this order. Furthermore, a conductor 366 is formed in the insulator 360, the insulator 362, and the insulator 364. The conductor 366 has a function of a plug or a wiring. Note that the conductor 366 can be provided using a material similar to those for the conductor 328 and the conductor 330.

Note that for example, an insulator having a barrier property against hydrogen is preferably used as the insulator 360, like the insulator 324. Furthermore, the conductor 366 preferably contains a conductor having a barrier property against hydrogen. In particular, the conductor having a barrier property against hydrogen is formed in an opening portion of the insulator 360 having a barrier property against hydrogen. With the structure, the transistor 300 and the transistor 500 can be separated by a barrier layer, so that diffusion of hydrogen from the transistor 300 into the transistor 500 can be inhibited.

A wiring layer may be provided over the insulator 364 and the conductor 366. For example, in FIG. 11, an insulator 370, an insulator 372, and an insulator 374 are stacked in this order. Furthermore, a conductor 376 is formed in the insulator 370, the insulator 372, and the insulator 374. The conductor 376 has a function of a plug or a wiring. Note that the conductor 376 can be provided using a material similar to those for the conductor 328 and the conductor 330.

Note that for example, an insulator having a barrier property against hydrogen is preferably used as the insulator 370, like the insulator 324. Furthermore, the conductor 376 preferably contains a conductor having a barrier property against hydrogen. In particular, the conductor having a barrier property against hydrogen is formed in an opening portion of the insulator 370 having a barrier property against hydrogen. With the structure, the transistor 300 and the transistor 500 can be separated by a barrier layer, so that diffusion of hydrogen from the transistor 300 into the transistor 500 can be inhibited.

A wiring layer may be provided over the insulator 374 and the conductor 376. For example, in FIG. 11, an insulator 380, an insulator 382, and an insulator 384 are stacked in this order. Furthermore, a conductor 386 is formed in the insulator 380, the insulator 382, and the insulator 384. The conductor 386 has a function of a plug or a wiring. Note that the conductor 386 can be provided using a material similar to those for the conductor 328 and the conductor 330.

Note that for example, an insulator having a barrier property against hydrogen is preferably used as the insulator 380, like the insulator 324. Furthermore, the conductor 386 preferably contains a conductor having a barrier property against hydrogen. In particular, the conductor having a barrier property against hydrogen is formed in an opening portion of the insulator 380 having a barrier property against hydrogen. With the structure, the transistor 300 and the transistor 500 can be separated by a barrier layer, so that diffusion of hydrogen from the transistor 300 into the transistor 500 can be inhibited.

Although the wiring layer including the conductor 356, the wiring layer including the conductor 366, the wiring layer including the conductor 376, and the wiring layer including the conductor 386 are described above, the semiconductor device of this embodiment is not limited thereto. Three or less wiring layers that are similar to the wiring layer including the conductor 356 may be provided, or five or more wiring layers that are similar to the wiring layer including the conductor 356 may be provided.

An insulator 510, an insulator 512, an insulator 514, and an insulator 516 are stacked in this order over the insulator 384. A substance having a barrier property against oxygen or hydrogen is preferably used for any of the insulator 510, the insulator 512, the insulator 514, and the insulator 516.

For example, for the insulator 510 and the insulator 514, it is preferable to use a film having a barrier property that prevents diffusion of hydrogen or impurities from the substrate 311, a region where the transistor 300 is provided, or the like into the region where the transistor 500 is provided. Therefore, a material similar to that for the insulator 324 can be used.

For the film having a barrier property against hydrogen, silicon nitride formed by a CVD method can be used, for example. Here, diffusion of hydrogen into a semiconductor element including an oxide semiconductor, such as the transistor 500, degrades the characteristics of the semiconductor element in some cases. Therefore, a film that inhibits hydrogen diffusion is preferably used between the transistor 500 and the transistor 300. The film that inhibits hydrogen diffusion is specifically a film from which a small amount of hydrogen is released.

In addition, for the film having a barrier property against hydrogen, a metal oxide such as aluminum oxide, hafnium oxide, or tantalum oxide is preferably used for the insulator 510 and the insulator 514, for example.

In particular, aluminum oxide has an excellent blocking effect that prevents the passage of both oxygen and impurities such as hydrogen and moisture which are factors of a change in electrical characteristics of the transistor. Accordingly, aluminum oxide can prevent mixing of impurities such as hydrogen and moisture into the transistor 500 in a manufacturing process and after manufacturing of the transistor. In addition, release of oxygen from the oxide included in the transistor 500 can be inhibited. Therefore, aluminum oxide is suitably used for a protective film of the transistor 500.

In addition, for the insulator 512 and the insulator 516, a material similar to that for the insulator 320 can be used, for example. Furthermore, when a material with a comparatively low permittivity is used for these insulators, parasitic capacitance generated between wirings can be reduced. A silicon oxide film, a silicon oxynitride film, or the like can be used for the insulator 512 and the insulator 516, for example.

Furthermore, a conductor 518, a conductor included in the transistor 500 (e.g., a conductor 503), and the like are embedded in the insulator 510, the insulator 512, the insulator 514, and the insulator 516. Note that the conductor 518 has a function of a plug or a wiring that is connected to the capacitor 600 or the transistor 300. The conductor 518 can be provided using a material similar to those for the conductor 328 and the conductor 330.

In particular, the conductor 518 in a region in contact with the insulator 510 and the insulator 514 is preferably a conductor having a barrier property against oxygen, hydrogen, and water. With the structure, the transistor 300 and the transistor 500 can be separated by a layer having a barrier property against oxygen, hydrogen, and water; thus, diffusion of hydrogen from the transistor 300 into the transistor 500 can be inhibited.

The transistor 500 is provided above the insulator 516.

As illustrated in FIG. 13A and FIG. 13B, the transistor 500 includes the conductor 503 positioned to be embedded in the insulator 514 and the insulator 516, an insulator 520 positioned over the insulator 516 and the conductor 503, an insulator 522 positioned over the insulator 520, an insulator 524 positioned over the insulator 522, an oxide 530a positioned over the insulator 524, an oxide 530b positioned over the oxide 530a, a conductor 542a and a conductor 542b positioned apart from each other over the oxide 530b, an insulator 580 that is positioned over the conductor 542a and the conductor 542b and is provided with an opening formed to overlap with a region between the conductor 542a and the conductor 542b, an oxide 530c positioned on a bottom and a side surface of the opening, an insulator 550 positioned on a formation surface of the oxide 530c, and a conductor 560 positioned on a formation surface of the insulator 550.

As illustrated in FIG. 13A and FIG. 13B, an insulator 544 is preferably provided between the insulator 580 and the oxide 530a, the oxide 530b, the conductor 542a, and the conductor 542b. As illustrated in FIG. 13A and FIG. 13B, the conductor 560 preferably includes a conductor 560a provided on the inner side of the insulator 550 and a conductor 560b embedded inside the conductor 560a. As illustrated in FIG. 13A and FIG. 13B, an insulator 574 is preferably provided over the insulator 580, the conductor 560, the insulator 550, and the oxide 530c.

Note that in the following description, the oxide 530a, the oxide 530b, and the oxide 530c are sometimes collectively referred to as an oxide 530.

Note that although a structure of the transistor 500 in which three layers of the oxide 530a, the oxide 530b, and the oxide 530c are stacked in a region where a channel is formed and its vicinity is shown, the present invention is not limited thereto. For example, a single layer of the oxide 530b, a two-layer structure of the oxide 530b and the oxide 530a, a two-layer structure of the oxide 530b and the oxide 530c, or a stacked-layer structure of four or more layers may be employed. Although the conductor 560 is shown to have a stacked-layer structure of two layers in the transistor 500, the present invention is not limited thereto. For example, the conductor 560 may have a single-layer structure or a stacked-layer structure of three or more layers. Moreover, the transistor 500 illustrated in FIG. 11 and FIG. 13A is an example and the structure is not limited thereto; an appropriate transistor is used in accordance with a circuit configuration or a driving method.

Here, the conductor 560 functions as a gate electrode of the transistor, and the conductor 542a and the conductor 542b each function as a source electrode or a drain electrode. As described above, the conductor 560 is formed to be embedded in the opening of the insulator 580 and the region between the conductor 542a and the conductor 542b. The positions of the conductor 560, the conductor 542a, and the conductor 542b with respect to the opening of the insulator 580 are selected in a self-aligned manner. That is, in the transistor 500, the gate electrode can be positioned between the source electrode and the drain electrode in a self-aligned manner. Therefore, the conductor 560 can be formed without an alignment margin, resulting in a reduction in the area occupied by the transistor 500. Accordingly, miniaturization and high integration of the semiconductor device can be achieved.

In addition, since the conductor 560 is formed in the region between the conductor 542a and the conductor 542b in a self-aligned manner, the conductor 560 does not have a region overlapping with the conductor 542a or the conductor 542b. Thus, parasitic capacitance formed between the conductor 560 and each of the conductor 542a and the conductor 542b can be reduced. As a result, the switching speed of the transistor 500 can be improved, and the transistor 500 can have high frequency characteristics.

The conductor 560 sometimes functions as a first gate (also referred to as top gate) electrode. In addition, the conductor 503 sometimes functions as a second gate (also referred to as bottom gate) electrode. In that case, the threshold voltage of the transistor 500 can be controlled by changing a potential applied to the conductor 503 independently of a potential applied to the conductor 560. In particular, the threshold voltage of the transistor 500 can be higher than 0 V and the off-state current can be reduced by applying a negative potential to the conductor 503. Thus, a drain current at the time when a potential applied to the conductor 560 is 0 V can be lower in the case where a negative potential is applied to the conductor 503 than in the case where a negative potential is not applied to the conductor 503.

The conductor 503 is positioned to overlap with the oxide 530 and the conductor 560. Thus, in the case where potentials are applied to the conductor 560 and the conductor 503, an electric field generated from the conductor 560 and an electric field generated from the conductor 503 are connected, so that the channel formation region formed in the oxide 530 can be covered. In this specification and the like, a transistor structure in which a channel formation region is electrically surrounded by electric fields of a first gate electrode and a second gate electrode is referred to as a surrounded channel (S-channel) structure.

In addition, the conductor 503 has a structure similar to that of the conductor 518; a conductor 503a is formed in contact with an inner wall of an opening in the insulator 514 and the insulator 516, and a conductor 503b is formed on the inner side. Note that although the transistor 500 having a structure in which the conductor 503a and the conductor 503b are stacked is shown, the present invention is not limited thereto. For example, the conductor 503 may be provided as a single layer or to have a stacked-layer structure of three or more layers.

Here, for the conductor 503a, a conductive material that has a function of inhibiting diffusion of impurities such as a hydrogen atom, a hydrogen molecule, a water molecule, and a copper atom (through which the impurities are less likely to pass) is preferably used. Alternatively, it is preferable to use a conductive material that has a function of inhibiting diffusion of oxygen (e.g., at least one of an oxygen atom, an oxygen molecule, and the like) (through which oxygen is less likely to pass). Note that in this specification, a function of inhibiting diffusion of impurities or oxygen means a function of inhibiting diffusion of any one or all of the impurities and oxygen.

For example, when the conductor 503a has a function of inhibiting diffusion of oxygen, a reduction in conductivity of the conductor 503b due to oxidation can be inhibited.

In addition, in the case where the conductor 503 also functions as a wiring, a conductive material with high conductivity that contains tungsten, copper, or aluminum as its main component is preferably used for the conductor 503b. In that case, a conductor 505 is not necessarily provided. Note that the conductor 503b is shown as a single layer but may have a stacked-layer structure, for example, a stack of the above conductive material and titanium or titanium nitride.

The insulator 520, the insulator 522, and the insulator 524 have a function of a second gate insulating film.

Here, as the insulator 524 in contact with the oxide 530, an insulator that contains oxygen more than oxygen in the stoichiometric composition is preferably used. That is, an excess-oxygen region is preferably formed in the insulator 524. When such an insulator containing excess oxygen is provided in contact with the oxide 530, oxygen vacancies in the oxide 530 can be reduced and the reliability of the transistor 500 can be improved.

As the insulator including an excess-oxygen region, specifically, an oxide material that releases part of oxygen by heating is preferably used. An oxide that releases oxygen by heating is an oxide film in which the amount of released oxygen converted into oxygen atoms is greater than or equal to $1.0 \times 10^{18}$ atoms/cm$^3$, preferably greater than or equal to $1.0 \times 10^{19}$ atoms/cm$^3$, further preferably greater than or equal to $2.0 \times 10^{19}$ atoms/cm$^3$ or greater than or equal to $3.0 \times 10^{20}$ atoms/cm$^3$ in TDS (Thermal Desorption Spectroscopy) analysis. Note that the temperature of the film surface in the TDS analysis is preferably in a range of higher than or equal to 100° C. and lower than or equal to 700° C., or higher than or equal to 10° C. and lower than or equal to 400° C.

One or more of heat treatment, microwave treatment, and RF treatment may be performed in a state in which the insulator including the excess-oxygen region and the oxide 530 are in contact with each other. By the treatment, water or hydrogen in the oxide 530 can be removed. For example, in the oxide 530, dehydrogenation can be performed when a reaction in which a bond of $V_oH$ is cut occurs, i.e., a reaction of "$V_oH \rightarrow V_o+H$" occurs. Part of hydrogen generated at this time is bonded to oxygen to be $H_2O$, and removed from the oxide 530 or an insulator in the vicinity of the oxide 530 in some cases. Part of hydrogen is diffused into or gettered by the conductor 542 in some cases.

For the microwave treatment, for example, an apparatus including a power source that generates high-density plasma or an apparatus including a power source that applies RF to the substrate side is suitably used. For example, the use of an oxygen-containing gas and high-density plasma enables high-density oxygen radicals to be generated, and application of the RF to the substrate side allows the oxygen radicals generated by the high-density plasma to be efficiently introduced into the oxide 530 or an insulator in the vicinity of the oxide 530. The pressure in the microwave treatment is higher than or equal to 133 Pa, preferably higher than or equal to 200 Pa, further preferably higher than or equal to 400 Pa. As a gas introduced into an apparatus for performing the microwave treatment, for example, oxygen and argon are used and the oxygen flow rate ($O_2/(O_2+Ar)$) is lower than or equal to 50%, preferably higher than or equal to 10% and lower than or equal to 30%.

In a manufacturing process of the transistor 500, the heat treatment is preferably performed with the surface of the oxide 530 exposed. The heat treatment is performed at higher than or equal to 100° C. and lower than or equal to 45° C., preferably higher than or equal to 350° C. and lower than or equal to 400° C., for example. Note that the heat treatment is performed in a nitrogen gas or inert gas atmosphere, or an atmosphere containing an oxidizing gas at 10 ppm or more, 1% or more, or 10% or more. For example, the heat treatment is preferably performed in an oxygen atmosphere. Accordingly, oxygen can be supplied to the oxide 530 to reduce oxygen vacancies ($V_o$). The heat treatment may be performed under reduced pressure. Alternatively, the heat treatment may be performed in such a manner that heat treatment is performed in a nitrogen gas or inert gas atmosphere, and then another heat treatment is performed in an atmosphere containing an oxidizing gas at 10 ppm or more, 1% or more, or 10% or more in order to compensate for released oxygen. Alternatively, the heat treatment may be performed in such a manner that heat treatment is performed in an atmosphere containing an oxidizing gas at 10 ppm or more, 1% or more, or 10% or more, and then another heat treatment is successively performed in a nitrogen gas or inert gas atmosphere.

Note that oxygen adding treatment performed on the oxide 530 can promote a reaction in which oxygen vacancies in the oxide 530 are filled with supplied oxygen, i.e., a reaction of "$V_o+O \rightarrow null$". Furthermore, hydrogen remaining in the oxide 530 reacts with supplied oxygen, so that the hydrogen can be removed as $H_2O$ (dehydration). This can inhibit recombination of hydrogen remaining in the oxide 530 with oxygen vacancies and formation of $V_oH$.

In the case where the insulator 524 includes an excess-oxygen region, it is preferable that the insulator 522 have a function of inhibiting diffusion of oxygen (e.g., an oxygen atom, an oxygen molecule, or the like) (through which oxygen is less likely to pass).

When the insulator 522 has a function of inhibiting diffusion of oxygen or impurities, oxygen contained in the oxide 530 is not diffused into the insulator 520 side, which is preferable. Furthermore, the conductor 503 can be inhibited from reacting with oxygen contained in the insulator 524 or the oxide 530.

For the insulator 522, a single layer or stacked layers of an insulator containing what is called a high-k material such as aluminum oxide, hafnium oxide, an oxide containing aluminum and hafnium (hafnium aluminate), tantalum oxide, zirconium oxide, lead zirconate titanate (PZT), strontium titanate ($SrTiO_3$), or $(Ba,Sr)TiO_3$ (BST) are preferably used, for example. As miniaturization and high integration of transistors progress, a problem such as leakage current might arise because of a thinner gate insulating film. When a high-k material is used for an insulator functioning as the gate insulating film, a gate potential during operation of the transistor can be reduced while the physical thickness is maintained.

It is particularly preferable to use an insulator containing an oxide of one or both of aluminum and hafnium, which is an insulating material having a function of inhibiting diffusion of impurities, oxygen, and the like (through which oxygen is less likely to pass). Aluminum oxide, hafnium oxide, an oxide containing aluminum and hafnium (hafnium aluminate), or the like is preferably used as the insulator containing an oxide of one or both of aluminum and hafnium. In the case where the insulator 522 is formed using such a material, the insulator 522 functions as a layer that inhibits release of oxygen from the oxide 530 and mixing of impurities such as hydrogen from the periphery of the transistor 500 into the oxide 530.

Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. The insulator over which silicon oxide, silicon oxynitride, or silicon nitride is stacked may be used.

In addition, it is preferable that the insulator 520 be thermally stable. For example, silicon oxide and silicon oxynitride are suitable because they are thermally stable. Furthermore, when an insulator which is a high-k material is combined with silicon oxide or silicon oxynitride, the insulator 520 having a stacked-layer structure that has thermal stability and a high relative permittivity can be obtained.

Note that the transistor 500 in FIG. 13A and FIG. 13B includes the insulator 520, the insulator 522, and the insulator 524 as the second gate insulating film having a three-layer structure; however, the second gate insulating film may have a single-layer structure, a two-layer structure, or a stacked-layer structure of four or more layers. In such cases, without limitation to a stacked-layer structure formed of the same material, a stacked-layer structure formed of different materials may be employed.

In the transistor 500, a metal oxide functioning as an oxide semiconductor is preferably used as the oxide 530 including the channel formation region. For example, as the oxide 530, a metal oxide such as an In—M—Zn oxide (an element M is one or more kinds selected from aluminum, gallium, yttrium, copper, vanadium, beryllium, boron, titanium, iron, nickel, germanium, zirconium, molybdenum, lanthanum, cerium, neodymium, hafnium, tantalum, tungsten, magnesium, and the like) is preferably used. The In—M—Zn oxide that can be used as the oxide 530 is particularly preferably a CAAC-OS or a CAC-OS. Furthermore, as the oxide 530, an In—Ga oxide or an In—Zn oxide may be used.

Furthermore, a metal oxide with a low carrier concentration is preferably used for the transistor 500. In order to reduce the carrier concentration of the metal oxide, the concentration of impurities in the metal oxide is reduced so that the density of defect states can be reduced. In this specification and the like, a state with a low impurity concentration and a low density of defect states is referred to as a highly purified intrinsic or substantially highly purified intrinsic state. As examples of the impurities in the metal oxide, hydrogen, nitrogen, alkali metal, alkaline earth metal, iron, nickel, silicon, and the like are given.

In particular, hydrogen contained in a metal oxide reacts with oxygen bonded to a metal atom to be water, and thus forms oxygen vacancies in the metal oxide in some cases. In the case where hydrogen enters an oxygen vacancy in the oxide 530, the oxygen vacancy and the hydrogen are bonded to each other to form $V_oH$ in some cases. The $V_oH$ serves as a donor and an electron that is a carrier is generated in some cases. In other cases, bonding of part of hydrogen to oxygen bonded to a metal atom generates an electron serving as a carrier. Thus, a transistor using a metal oxide containing much hydrogen is likely to have normally-on characteristics. Moreover, hydrogen in a metal oxide easily moves by stress such as heat and an electric field; thus, the reliability of a transistor may be low when the metal oxide contains a plenty of hydrogen. In one embodiment of the present invention, $V_oH$ in the oxide 530 is preferably reduced as much as possible so that the oxide 530 becomes a highly purified intrinsic or substantially highly purified intrinsic oxide. It is important to remove impurities such as moisture and hydrogen in a metal oxide (sometimes described as dehydration or dehydrogenation treatment) and to compensate for oxygen vacancies by supplying oxygen to the metal oxide (sometimes described as oxygen adding treatment) to obtain a metal oxide whose $V_oH$ is reduced enough. When a metal oxide with a sufficiently low concentration of impurities such as $V_oH$ is used for a channel formation region of a transistor, the transistor can have stable electrical characteristics.

A defect in which hydrogen has entered an oxygen vacancy can function as a donor of the metal oxide. However, it is difficult to evaluate the defects quantitatively. Thus, the metal oxide is evaluated by carrier concentration, not by donor concentration, in some cases. Therefore, in this specification and the like, the carrier concentration assuming a state where an electric field is not applied is sometimes used, instead of the donor concentration, as the parameter of the metal oxide. That is, "carrier concentration" in this specification and the like can be replaced with "donor concentration" in some cases.

Therefore, when a metal oxide is used as the oxide 530, hydrogen in the metal oxide is preferably reduced as much as possible. Specifically, the hydrogen concentration of the metal oxide, which is measured by secondary ion mass spectrometry (SIMS), is lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$. When a metal oxide with a sufficiently low concentration of impurities such as hydrogen is used for a channel formation region of a transistor, the transistor can have stable electrical characteristics.

In the case where a metal oxide is used as the oxide 530, the carrier concentration of the metal oxide in the channel formation region is preferably lower than or equal to $1\times10^{18}$ cm$^{-3}$, further preferably lower than $1\times10^{17}$ cm$^{-3}$, still further preferably lower than $1\times10^{16}$ cm$^{-3}$, yet further preferably lower than $1\times10^{13}$ cm$^{-3}$, and yet still further preferably lower than $1\times10^{12}$ cm$^{-3}$. Note that the lower limit of the carrier concentration of the metal oxide in the channel formation region is not particularly limited and can be, for example, $1\times10^{-9}$ cm$^{-3}$.

When a metal oxide is used as the oxide 530, contact between the conductor 542 (the conductor 542a and the conductor 542b) and the oxide 530 may make oxygen in the oxide 530 diffuse into the conductor 542, resulting in oxidation of the conductor 542. It is highly possible that oxidation of the conductor 542 lowers the conductivity of the conductor 542. Note that diffusion of oxygen in the oxide 530 into the conductor 542 can be rephrased as absorption of oxygen in the oxide 530 by the conductor 542.

When oxygen in the oxide 530 diffuses into the conductor 542 (the conductor 542a and the conductor 542b), a layer is sometimes formed between the conductor 542a and the oxide 530b and between the conductor 542b and the oxide 530b. The layer contains more oxygen than the conductor 542 does, and thus the layer presumably has an insulating property. At this time, the three-layer structure of the conductor 542, the layer, and the oxide 530b can be regarded as a three-layer structure formed of a metal, an insulator, and a semiconductor and is sometimes referred to as a MIS (Metal-Insulator-Semiconductor) structure or a diode junction structure that mainly has a MIS structure.

Note that the layer is not limited to be formed between the conductor 542 and the oxide 530b; for example, the layer may be formed between the conductor 542 and the oxide 530c, between the conductor 542 and the oxide 530b, and between the conductor 542 and the oxide 530c.

The metal oxide functioning as the channel formation region in the oxide 530 has a band gap of more than or equal to 2 eV, preferably more than or equal to 2.5 eV. With the use of a metal oxide having such a wide bandgap, the off-state current of the transistor can be reduced.

By including the oxide 530a under the oxide 530b, the oxide 530 can inhibit diffusion of impurities into the oxide 530b from the components formed below the oxide 530a. By including the oxide 530c over the oxide 530b, the oxide 530 can inhibit diffusion of impurities into the oxide 530b from the components formed above the oxide 530c.

Note that the oxide 530 preferably has a stacked-layer structure of oxides that differ in the atomic ratio of metal atoms. Specifically, the atomic ratio of the element M to the constituent elements in the metal oxide used as the oxide 530a is preferably higher than the atomic ratio of the element M to the constituent elements in the metal oxide used as the oxide 530b. In addition, the atomic ratio of the element M to In in the metal oxide used as the oxide 530a is preferably higher than the atomic ratio of the element M to In in the metal oxide used as the oxide 530b. Furthermore, the atomic ratio of In to the element M in the metal oxide used as the oxide 530b is preferably higher than the atomic ratio of In to the element M in the metal oxide used as the oxide 530a. Moreover, a metal oxide that can be used as the oxide 530a or the oxide 530b can be used as the oxide 530c.

In addition, the energy of the conduction band minimum of each of the oxide 530a and the oxide 530c is preferably higher than the energy of the conduction band minimum of the oxide 530b. In other words, the electron affinity of each of the oxide 530a and the oxide 530c is preferably smaller than the electron affinity of the oxide 530b.

Here, the energy level of the conduction band minimum gradually changes at junction portions of the oxide 530a, the oxide 530b, and the oxide 530c. In other words, the energy level of the conduction band minimum at the junction portions of the oxide 530a, the oxide 530b, and the oxide 530c continuously changes or is continuously connected. To change the energy level gradually, the densities of defect states in mixed layers formed at an interface between the oxide 530a and the oxide 530b and an interface between the oxide 530b and the oxide 530c are preferably made low.

Specifically, when the oxide 530a and the oxide 530b or the oxide 530b and the oxide 530c contain a common element (as a main component) in addition to oxygen, a mixed layer with a low density of defect states can be formed. For example, in the case where the oxide 530b is an In—Ga—Zn oxide, an In—Ga—Zn oxide, a Ga—Zn oxide, gallium oxide, or the like is preferably used as the oxide 530a and the oxide 530c.

At this time, the oxide 530b serves as a main carrier path. When the oxide 530a and the oxide 530c have the above structures, the densities of defect states at the interface between the oxide 530a and the oxide 530b and the interface between the oxide 530b and the oxide 530c can be made low. Thus, the influence of interface scattering on carrier conduction is small, and the transistor 500 can have a high on-state current.

The conductor 542a and the conductor 542b functioning as the source electrode and the drain electrode are provided over the oxide 530b. For the conductor 542a and conductor 542b, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing the above metal element; an alloy containing a combination of the above metal element; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. In addition, tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen. Furthermore, a metal nitride film of tantalum nitride or the like is preferable because it has a barrier property against hydrogen or oxygen.

In addition, although the conductor 542a and the conductor 542b each having a single-layer structure are illustrated in FIG. 13, a stacked-layer structure of two or more layers may be employed. For example, it is preferable to stack a tantalum nitride film and a tungsten film. Alternatively, a titanium film and an aluminum film may be stacked. Further alternatively, a two-layer structure where an aluminum film is stacked over a tungsten film, a two-layer structure where a copper film is stacked over a copper-magnesium-aluminum alloy film, a two-layer structure where a copper film is stacked over a titanium film, or a two-layer structure where a copper film is stacked over a tungsten film may be employed.

Other examples include a three-layer structure where a titanium film or a titanium nitride film is formed, an aluminum film or a copper film is stacked over the titanium film or the titanium nitride film, and a titanium film or a titanium nitride film is formed over the aluminum film or the copper film; and a three-layer structure where a molybdenum film or a molybdenum nitride film is formed, an aluminum film or a copper film is stacked over the molybdenum film or the molybdenum nitride film, and a molybdenum film or a molybdenum nitride film is formed over the aluminum film or the copper film. Note that a transparent conductive material containing indium oxide, tin oxide, or zinc oxide may be used.

As illustrated in FIG. 13A, a region 543a and a region 543b are sometimes formed as low-resistance regions in the oxide 530 at an interface with the conductor 542a (the conductor 542b) and in the vicinity of the interface. In that case, the region 543a functions as one of a source region and a drain region, and the region 543b functions as the other of the source region and the drain region. Furthermore, the channel formation region is formed in a region between the region 543a and the region 543b.

When the conductor 542a (the conductor 542b) is provided to be in contact with the oxide 530, the oxygen concentration in the region 543a (the region 543b) sometimes decreases. In addition, a metal compound layer that contains the metal contained in the conductor 542a (the conductor 542b) and the component of the oxide 530 is sometimes formed in the region 543a (the region 543b). In such a case, the carrier density of the region 543a (the region 543b) increases, and the region 543a (the region 543b) becomes a low-resistance region.

The insulator 544 is provided to cover the conductor 542a and the conductor 542b and inhibits oxidation of the conductor 542a and the conductor 542b. At this time, the insulator 544 may be provided to cover a side surface of the oxide 530 and to be in contact with the insulator 524.

A metal oxide containing one kind or two or more kinds selected from hafnium, aluminum, gallium, yttrium, zirconium, tungsten, titanium, tantalum, nickel, germanium, neodymium, lanthanum, magnesium, and the like can be used for the insulator 544. Alternatively, silicon nitride oxide, silicon nitride, or the like can be used for the insulator 544.

It is particularly preferable to use an insulator containing an oxide of one or both of aluminum and hafnium, such as aluminum oxide, hafnium oxide, or an oxide containing aluminum and hafnium (hafnium aluminate), for the insulator 544. In particular, hafnium aluminate has higher heat resistance than a hafnium oxide film. Therefore, hafnium aluminate is preferable because it is less likely to be crystallized by heat treatment in a later step. Note that the insulator 544 is not an essential component when the conductor 542a and the conductor 542b are an oxidation-resistant material or a material that does not significantly lose its conductivity even after absorbing oxygen. Design is appropriately set in consideration of required transistor characteristics.

When the insulator 544 is included, diffusion of impurities such as water and hydrogen contained in the insulator 580 into the oxide 530b through the oxide 530c and the insulator 550 can be inhibited.

The insulator 550 functions as a first gate insulating film. The insulator 550 is preferably positioned in contact with the inner side (a top surface and a side surface) of the oxide 530c. Like the insulator 524, the insulator 550 is preferably formed using an insulator that contains excess oxygen and releases oxygen by heating.

Specifically, silicon oxide containing excess oxygen, silicon oxynitride, silicon nitride oxide, silicon nitride, silicon oxide to which fluorine is added, silicon oxide to which carbon is added, silicon oxide to which carbon and nitrogen are added, or porous silicon oxide can be used. In particular, silicon oxide and silicon oxynitride are preferable because they are thermally stable.

When an insulator from which oxygen is released by heating is provided as the insulator 550 in contact with the top surface of the oxide 530c, oxygen can be effectively supplied from the insulator 550 to the channel formation region of the oxide 530b through the oxide 530c. Furthermore, as in the insulator 524, the concentration of impurities such as water or hydrogen in the insulator 550 is preferably lowered. The thickness of the insulator 550 is preferably greater than or equal to 1 nm and less than or equal to 20 nm.

Furthermore, to efficiently supply excess oxygen contained in the insulator 550 to the oxide 530, a metal oxide may be provided between the insulator 550 and the conductor 560. The metal oxide preferably inhibits diffusion of oxygen from the insulator 550 into the conductor 560. Providing the metal oxide that inhibits diffusion of oxygen inhibits diffusion of excess oxygen from the insulator 550 into the conductor 560. That is, a reduction in the amount of excess oxygen supplied to the oxide 530 can be inhibited. Moreover, oxidation of the conductor 560 due to excess oxygen can be inhibited. For the metal oxide, a material that can be used for the insulator 544 is used.

Note that the insulator 550 may have a stacked-layer structure like the second gate insulating film. As miniaturization and high integration of transistors progress, a problem such as leakage current might arise because of a thinner gate insulating film. For that reason, when the insulator functioning as the gate insulating film has a stacked-layer structure of a high-k material and a thermally stable material, a gate potential during transistor operation can be reduced while the physical thickness is maintained. Furthermore, the stacked-layer structure can be thermally stable and have a high relative permittivity.

Although the conductor 560 functioning as the first gate electrode has a two-layer structure in FIG. 13A and FIG. 13B, the conductor 560 may have a single-layer structure or a stacked-layer structure of three or more layers.

For the conductor 560a, it is preferable to use a conductive material having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, and the like), and a copper atom. Alternatively, it is preferable to use a conductive material having a function of inhibiting diffusion of oxygen (e.g., at least one of an oxygen atom, an oxygen molecule, and the like). When the conductor 560a has a function of inhibiting diffusion of oxygen, it is possible to inhibit a reduction in conductivity of the conductor 560b due to oxidation caused by oxygen contained in the insulator 550. As a conductive material having a function of inhibiting diffusion of oxygen, for example, tantalum, tantalum nitride, ruthenium, ruthenium oxide, or the like is preferably used. For the conductor 560a, the oxide semiconductor that can be used as the oxide 530 can be used. In that case, when the conductor 560b is deposited by a sputtering method, the conductor 560a can have a reduced electrical resistance value to be a conductor. Such a conductor can be referred to as an OC (Oxide Conductor) electrode.

In addition, a conductive material containing tungsten, copper, or aluminum as its main component is preferably used for the conductor 560b. Furthermore, the conductor 560b also functions as a wiring and thus a conductor having high conductivity is preferably used as the conductor 560b. For example, a conductive material containing tungsten, copper, or aluminum as its main component can be used. Moreover, the conductor 560b may have a stacked-layer structure, for example, a stacked-layer structure of the above conductive material and titanium or titanium nitride.

The insulator 580 is provided over the conductor 542a and the conductor 542b with the insulator 544 therebetween. The insulator 580 preferably includes an excess-oxygen region. For example, the insulator 580 preferably contains silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, resin, or the like. In particular, silicon oxide and silicon oxynitride are preferable because they are thermally stable. In particular, silicon oxide and porous silicon oxide are preferable because an excess-oxygen region can be easily formed in a later step.

The insulator 580 preferably includes an excess-oxygen region. When the insulator 580, which releases oxygen by heating, is provided in contact with the oxide 530c, oxygen in the insulator 580 can be efficiently supplied to the oxide 530 through the oxide 530c. Note that the concentration of impurities such as water or hydrogen in the insulator 580 is preferably reduced.

The opening of the insulator 580 is formed to overlap with the region between the conductor 542a and the conductor 542b. Accordingly, the conductor 560 is formed to be embedded in the opening of the insulator 580 and the region between the conductor 542a and the conductor 542b.

The gate length needs to be short for miniaturization of the semiconductor device, but it is necessary to prevent a reduction in conductivity of the conductor 560. When the conductor 560 is made thick to achieve this, the conductor 560 might have a shape with a high aspect ratio. In this embodiment, the conductor 560 is provided to be embedded in the opening of the insulator 580; thus, even when the conductor 560 has a shape with a high aspect ratio, the conductor 560 can be formed without collapsing during the process.

The insulator 574 is preferably provided in contact with a top surface of the insulator 580, a top surface of the conductor 560, a top surface of the insulator 550, and a top surface of the oxide 530c. When the insulator 574 is deposited by a sputtering method, excess-oxygen regions can be provided in the insulator 550 and the insulator 580. Accordingly, oxygen can be supplied from the excess-oxygen regions to the oxide 530.

For example, a metal oxide containing one kind or two or more kinds selected from hafnium, aluminum, gallium, yttrium, zirconium, tungsten, titanium, tantalum, nickel, germanium, magnesium, and the like can be used for the insulator 574.

In particular, aluminum oxide has a high barrier property, and even a thin aluminum oxide film having a thickness of greater than or equal to 0.5 nm and less than or equal to 3.0 nm can inhibit diffusion of hydrogen and nitrogen. Accordingly, aluminum oxide deposited by a sputtering method serves as an oxygen supply source and can also have a function of a barrier film against impurities such as hydrogen.

In addition, an insulator 581 functioning as an interlayer film is preferably provided over the insulator 574. As in the insulator 524 or the like, the concentration of impurities such as water or hydrogen in the insulator 581 is preferably reduced.

Furthermore, a conductor 540a and a conductor 540b are positioned in openings formed in the insulator 581, the insulator 574, the insulator 580, and the insulator 544. The conductor 540a and the conductor 540b are provided to face each other with the conductor 560 therebetween. The structures of the conductor 540a and the conductor 540b are similar to a structure of a conductor 546 and a conductor 548 that will be described later.

An insulator 582 is provided over the insulator 581. A substance having a barrier property against oxygen or hydrogen is preferably used for the insulator 582. Therefore, a material similar to that for the insulator 514 can be used for the insulator 582. For the insulator 582, a metal oxide such as aluminum oxide, hafnium oxide, or tantalum oxide is preferably used, for example.

In particular, aluminum oxide has an excellent blocking effect that prevents the passage of both oxygen and impurities such as hydrogen and moisture which are factors of a change in electrical characteristics of the transistor. Accordingly, aluminum oxide can prevent mixing of impurities such as hydrogen and moisture into the transistor 500 in a manufacturing process and after manufacturing of the transistor. In addition, release of oxygen from the oxide included in the transistor 500 can be inhibited. Therefore, aluminum oxide is suitably used for a protective film of the transistor 500.

In addition, an insulator 586 is provided over the insulator 582. For the insulator 586, a material similar to that for the insulator 320 can be used. Furthermore, when a material with a comparatively low permittivity is used for these insulators, parasitic capacitance generated between wirings can be reduced. A silicon oxide film, a silicon oxynitride film, or the like can be used for the insulator 586, for example.

Furthermore, the conductor 546, the conductor 548, and the like are embedded in the insulator 520, the insulator 522, the insulator 524, the insulator 544, the insulator 580, the insulator 574, the insulator 581, the insulator 582, and the insulator 586.

The conductor 546 and the conductor 548 have functions of plugs or wirings that are connected to the capacitor 600, the transistor 500, or the transistor 300. The conductor 546 and the conductor 548 can be provided using materials similar to those for the conductor 328 and the conductor 330.

Note that after the transistor 500 is formed, an opening may be formed to surround the transistor 500 and an insulator having a high barrier property against hydrogen or water may be formed to cover the opening. Surrounding the transistor 500 by the insulator having a high barrier property can prevent entry of moisture and hydrogen from the outside. Alternatively, a plurality of transistors 500 may be collectively surrounded by the insulator having a high barrier property against hydrogen or water. In the case where an opening is formed to surround the transistor 500, for example, the formation of an opening reaching the insulator 514 or the insulator 522 and the formation of the insulator having a high barrier property in contact with the insulator 514 or the insulator 522 are suitable because these formation steps can also serve as some of the manufacturing steps of the transistor 500. Note that for example, a material similar to that for the insulator 522 may be used for the insulator having a high barrier property against hydrogen or water.

Next, the capacitor 600 is provided above the transistor 500. The capacitor 600 includes a conductor 610, a conductor 620, and an insulator 630.

In addition, a conductor 612 may be provided over the conductor 546 and the conductor 548. The conductor 612 has a function of a plug or a wiring that is connected to the transistor 500. The conductor 610 has a function of an electrode of the capacitor 600. Note that the conductor 612 and the conductor 610 can be formed at the same time.

For the conductor 612 and the conductor 610, a metal film containing an element selected from molybdenum, titanium, tantalum, tungsten, aluminum, copper, chromium, neodymium, and scandium; a metal nitride film containing the above element as its component (a tantalum nitride film, a titanium nitride film, a molybdenum nitride film, or a tungsten nitride film); or the like can be used. Alternatively, it is possible to use a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added.

The conductor 612 and the conductor 610 each have a single-layer structure in FIG. 11; however, the structure is not limited thereto, and a stacked-layer structure of two or more layers may be employed. For example, between a conductor having a barrier property and a conductor having high conductivity, a conductor that is highly adhesive to the conductor having a barrier property and the conductor having high conductivity may be formed.

The conductor 620 is provided to overlap with the conductor 610 with the insulator 630 therebetween. Note that a conductive material such as a metal material, an alloy material, or a metal oxide material can be used for the conductor 620. It is preferable to use a high-melting-point material that has both heat resistance and conductivity, such as tungsten or molybdenum, and it is particularly preferable to use tungsten. In addition, in the case where the conductor 620 is formed concurrently with another component such as a conductor, Cu (copper), Al (aluminum), or the like, which is a low-resistance metal material, is used.

An insulator 640 is provided over the conductor 620 and the insulator 630. The insulator 640 can be provided using a material similar to that for the insulator 320. In addition, the insulator 640 may function as a planarization film that covers an uneven shape therebelow.

With the use of the structure, a semiconductor device using a transistor including an oxide semiconductor can be miniaturized or highly integrated.

Embodiment 3

In this embodiment, application examples of a semiconductor device will be described.

Example of Fabrication Method of Electronic Component

Figure 14A:
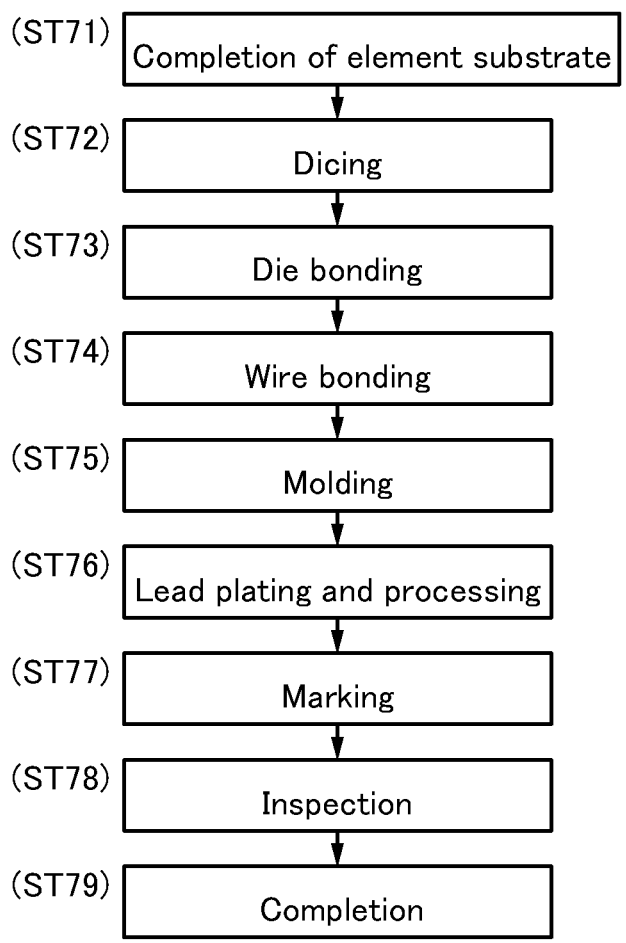
FIG. 14A, FIG. 14B, FIG. 14C, FIG. 14D, and FIG. 14E are diagrams illustrating a structure of an electronic component.

FIG. 14A is a flowchart illustrating an example of a fabrication method of an electronic component. The electronic component is also referred to as a semiconductor package or an IC package. The electronic component that is described below corresponds to an electronic component provided with transistors included in the semiconductor device.

A semiconductor device including transistors is completed by integrating a plurality of detachable components on a printed board through an assembly process (post-process). The post-process can be completed through steps illustrated in FIG. 14A. Specifically, after an element substrate obtained in a pre-process is completed (Step ST71), a rear surface of the substrate is ground. The substrate is thinned in this step to reduce warpage or the like of the substrate in the pre-process and to reduce the size of the component. Next, the substrate is divided into a plurality of chips in a dicing step (Step ST72).

Figure 14B:
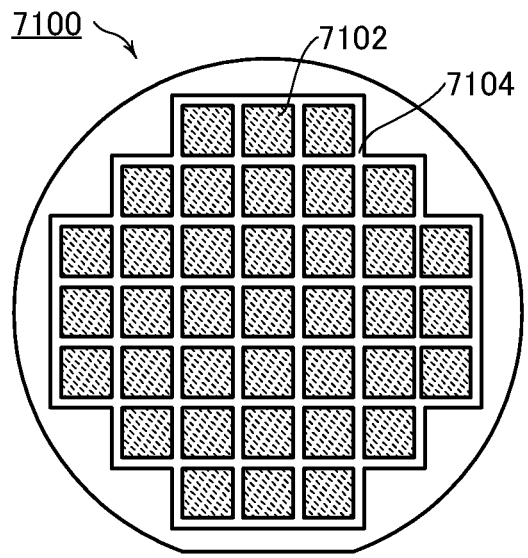
Figure 14C:
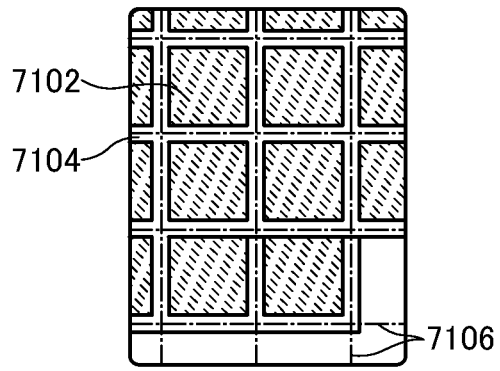

FIG. 14B is a top view of a semiconductor wafer 7100 before a dicing process. FIG. 14C is an enlarged view of part of FIG. 14B. A plurality of circuit regions 7102 are provided in the semiconductor wafer 7100. The semiconductor device of an embodiment of the present invention is provided in the circuit region 7102.

Figure 14D:
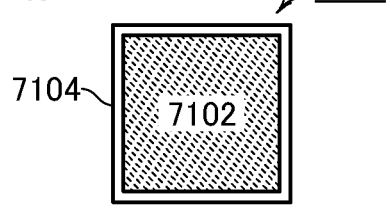

The plurality of circuit regions 7102 are each surrounded by a separation region 7104. Separation lines (also referred to as "dicing lines") 7106 are set at positions overlapping with the separation region 7104. In the dicing step ST72, the semiconductor wafer 7100 is cut along the separation lines 7106, whereby chips 7110 including the circuit regions 7102 are cut out from the semiconductor wafer 7100. FIG. 14D is an enlarged view of the chip 7110.

A conductive layer or a semiconductor layer may be provided in the separation region 7104. Providing a conductive layer or a semiconductor layer in the separation region 7104 relieves ESD (Electro Static Discharge) that might be caused in the dicing step, preventing a decrease in the yield due to the dicing step. A dicing step is generally performed while pure water whose specific resistance is decreased by dissolution of a carbonic acid gas or the like is supplied to a cut portion, in order to cool down a substrate, remove swarf, and prevent electrification, for example. Providing a conductive layer or a semiconductor layer in the separation region 7104 allows a reduction in the usage of the pure water. Therefore, the manufacturing cost of the semiconductor device can be reduced. Furthermore, the productivity of the semiconductor device can be increased.

After Step ST72 is performed, the divided chips are separately picked up to be mounted on and bonded to a lead frame in a die bonding step (Step ST73). As a method for bonding the chip to the lead frame in the die bonding step, a method suitable for the product may be selected. For example, the bonding may be performed with a resin or a tape. In the die bonding step, the chip may be mounted on and bonded to an interposer. In a wire bonding step, a lead of the lead frame and an electrode on the chip are electrically connected to each other with a metal fine line (wire) (Step ST74). A silver line or a gold line can be used as the metal fine line. Either ball bonding or wedge bonding may be used as the wire bonding.

A molding step is performed to seal the wire bonded chip with an epoxy resin or the like (Step ST75). With the molding step, the inside of the electronic component is filled with the resin, so that damage to the mounted circuit portion and wire due to mechanical external force can be reduced, and degradation in characteristics due to moisture or dust can be reduced. The lead of the lead frame is subjected to a plating treatment, and then the lead is cut and processed (Step ST76). This plating treatment prevents rust of the lead, and soldering at the time of mounting the electronic component on a printed board in a later step can be performed with higher reliability. Printing treatment (marking) is performed on a surface of the package (Step ST77). Through an inspection step (Step ST78), the electronic component is completed (Step ST79).

Figure 14E:
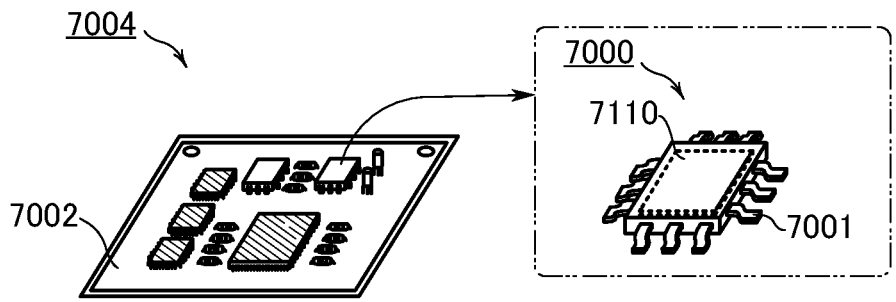

FIG. 14E illustrates a schematic perspective view of the completed electronic component. FIG. 14E illustrates a schematic perspective view of a QFP (Quad Flat Package) as an example of the electronic component. As illustrated in FIG. 14E, an electronic component 7000 includes a lead 7001 and the chip 7110.

The electronic component 7000 is mounted on a printed board 7002, for example. A plurality of electronic components 7000 that are combined and electrically connected to each other on the printed board 7002 can be mounted on an electronic device. A completed circuit board 7004 is provided in the electronic device or the like.

Example of Electronic Device

The power supply circuit and the semiconductor device of one embodiment of the present invention can be used for a display device, a personal computer, or an image reproducing device provided with recording media (typically, devices that reproduce the content of recording media such as DVDs: digital versatile discs and have displays for displaying the reproduced images). Other examples of electronic devices that can use the power supply circuit and the semiconductor device of one embodiment of the present invention include mobile phones, game machines including portable game machines, portable information terminals, e-book readers, cameras such as video cameras and digital still cameras, goggle-type displays (head mounted displays), navigation systems, audio reproducing devices (e.g., car audio units and digital audio players), copiers, facsimiles, printers, multifunction printers, automated teller machines (ATMs), vending machines, medical devices, drones, and vacuum cleaners. FIG. 15A to FIG. 15F illustrate specific examples of such electronic devices.

Figure 15A:
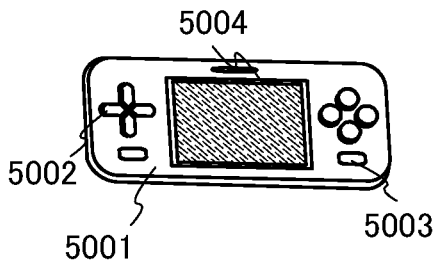
FIG. 15A, FIG. 15B, FIG. 15C, FIG. 15D, FIG. 15E, and FIG. 15F are diagrams illustrating application examples of semiconductor devices.

FIG. 15A illustrates a portable game machine that includes a housing 5001, operation keys 5002, speakers 5003, a display portion 5004, and the like. The semiconductor device of one embodiment of the present invention can be used for a variety of power supply circuits of a portable game machine.

Figure 15B:
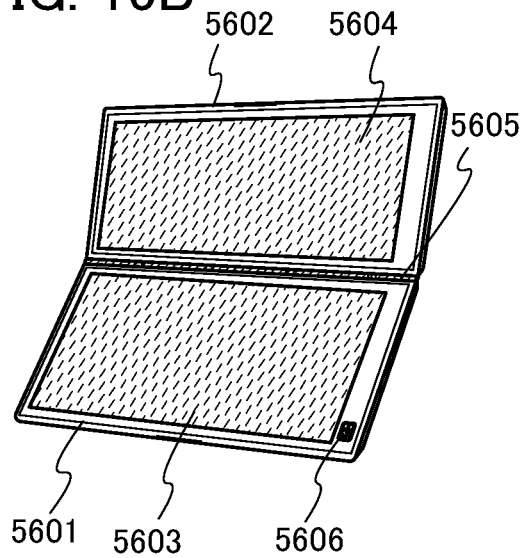

FIG. 15B illustrates a portable information terminal that includes a first housing 5601, a second housing 5602, a first display portion 5603, a second display portion 5604, a joint 5605, an operation key 5606, and the like. The semiconductor device of one embodiment of the present invention can be used for a variety of integrated circuits of a portable information terminal.

Figure 15C:
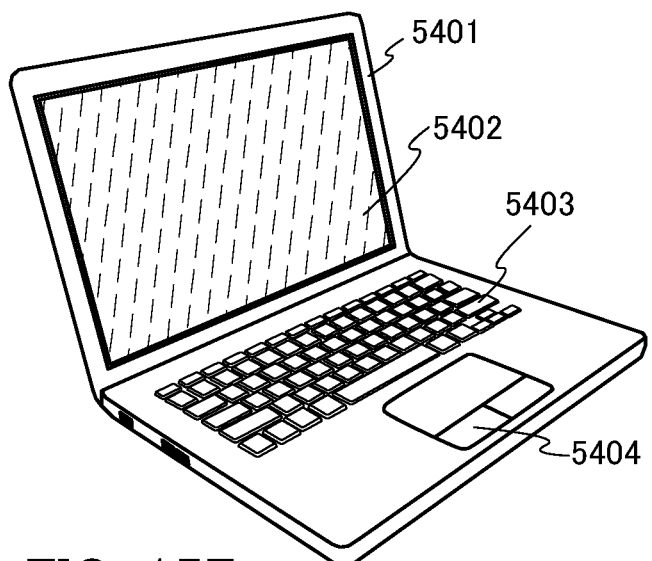

FIG. 15C illustrates a laptop personal computer that includes a housing 5401, a display portion 5402, a keyboard 5403, a pointing device 5404, and the like. The semiconductor device of one embodiment of the present invention can be used for a variety of power supply circuits of a laptop personal computer.

Figure 15D:
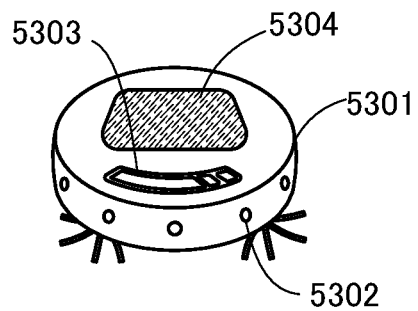

FIG. 15D illustrates a self-propelled vacuum cleaner that includes a housing 5301, sensors 5302, an operation portion 5303, a display portion 5304, and the like. The semiconductor device of one embodiment of the present invention can be used for a variety of power supply circuits in the housing 5301.

Figure 15E:
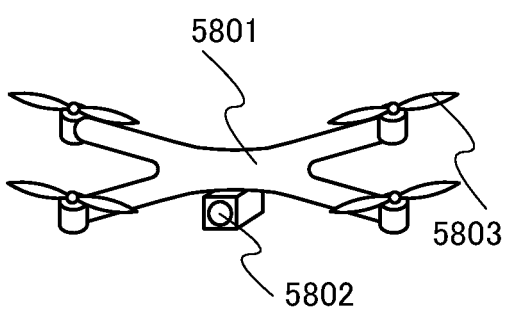

FIG. 15E illustrates a drone that includes a housing 5801, a camera 5802, propellers 5803, and the like. The semiconductor device of one embodiment of the present invention can be used for a variety of power supply circuits in the housing 5801.

Figure 15F:
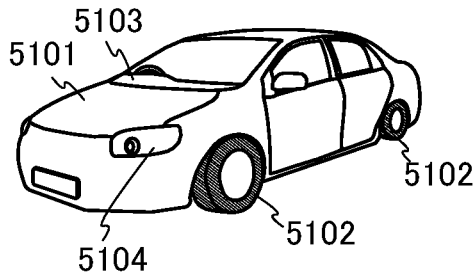

FIG. 15F illustrates an automobile that includes a car body 5101, wheels 5102, a dashboard 5103, lights 5104, and the like. The semiconductor device of one embodiment of the present invention can be used for a variety of power supply circuits of an automobile.

Embodiment 4

In this embodiment, structures of a power storage device and a power storage system to which the power supply circuit described in the above embodiment and an electronic component including the power supply circuit can be applied will be described.

Cylindrical Secondary Battery

Figure 16A:
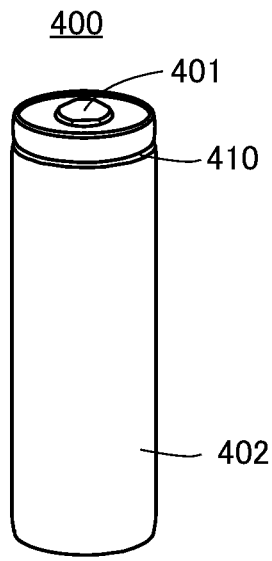
FIG. 16A, FIG. 16B, FIG. 16C, and FIG. 16D are diagrams illustrating electric devices of one embodiment of the present invention.

An example of a cylindrical secondary battery is described with reference to FIG. 16A. A cylindrical secondary battery 400 includes, as illustrated in FIG. 16A, a positive electrode cap (battery lid) 401 on a top surface and a battery can (outer can) 402 on a side surface and a bottom surface. The positive electrode cap 401 and the battery can (outer can) 402 are insulated from each other by a gasket (insulating packing) 410.

Figure 16B:
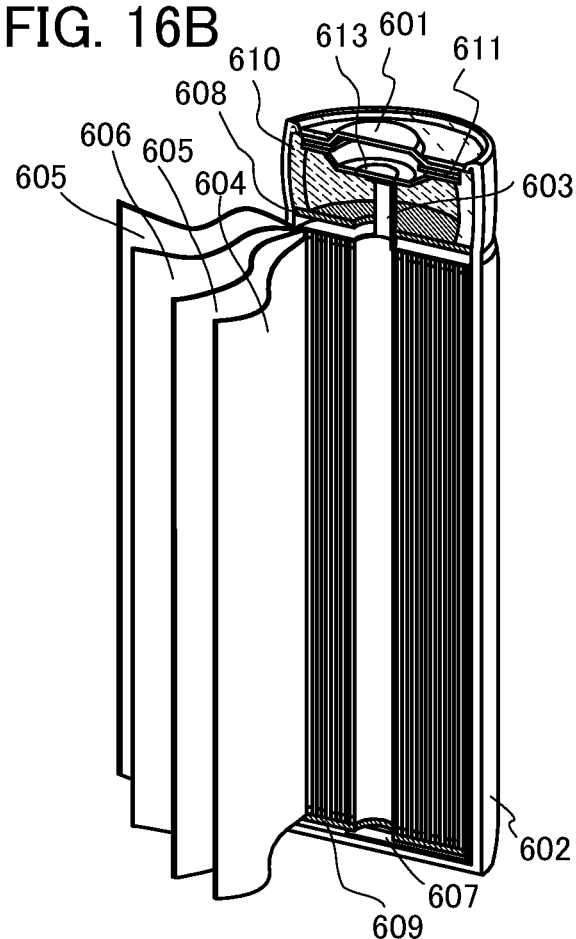

FIG. 16B is a schematic cross-sectional diagram of a cylindrical secondary battery. The cylindrical secondary battery illustrated in FIG. 16B includes a positive electrode cap (battery lid) 601 on a top surface and a battery can (outer can) 602 on a side surface and a bottom surface. The positive electrode cap and the battery can (outer can) 602 are insulated from each other by a gasket (insulating packing) 610.

Inside the battery can 602 having a hollow cylindrical shape, a battery element in which a belt-like positive electrode 604 and a belt-like negative electrode 606 are wound with a separator 605 located therebetween is provided. Although not illustrated, the battery element is wound centering around a center pin. One end of the battery can 602 is closed and the other end thereof is open. For the battery can 602, a metal having a corrosion-resistant property to an electrolyte solution, such as nickel, aluminum, or titanium, an alloy of such a metal, or an alloy of such a metal and another metal (e.g., stainless steel) can be used. Alternatively, the battery can 602 is preferably covered with nickel, aluminum, or the like in order to prevent corrosion due to the electrolyte solution. Inside the battery can 602, the battery element in which the positive electrode, the negative electrode, and the separator are wound is sandwiched between a pair of insulating plates 608 and 609 that face each other. Furthermore, a nonaqueous electrolyte (not illustrated) is injected inside the battery can 602 provided with the battery element. As the nonaqueous electrolyte, a nonaqueous electrolyte that is similar to that for a coin-type secondary battery can be used.

Since a positive electrode and a negative electrode that are used for a cylindrical storage battery are wound, active materials are preferably formed on both surfaces of a current collector. A positive electrode terminal (positive electrode current collector lead) 603 is connected to the positive electrode 604, and a negative electrode terminal (negative electrode current collector lead) 607 is connected to the negative electrode 606. For both the positive electrode terminal 603 and the negative electrode terminal 607, a metal material such as aluminum can be used. The positive electrode terminal 603 and the negative electrode terminal 607 are resistance-welded to a safety valve mechanism 613 and the bottom of the battery can 602, respectively. The safety valve mechanism 613 is electrically connected to the positive electrode cap 601 through a PTC element (Positive Temperature Coefficient) 611. The safety valve mechanism 613 cuts off electrical connection between the positive electrode cap 601 and the positive electrode 604 when the internal pressure of the battery exceeds a predetermined threshold. In addition, the PTC element 611 is a thermally sensitive resistor whose resistance increases as temperature rises, and limits the amount of current by increasing the resistance to prevent abnormal heat generation. Barium titanate ($BaTiO_3$)-based semiconductor ceramics or the like can be used for the PTC element.

Figure 16C:
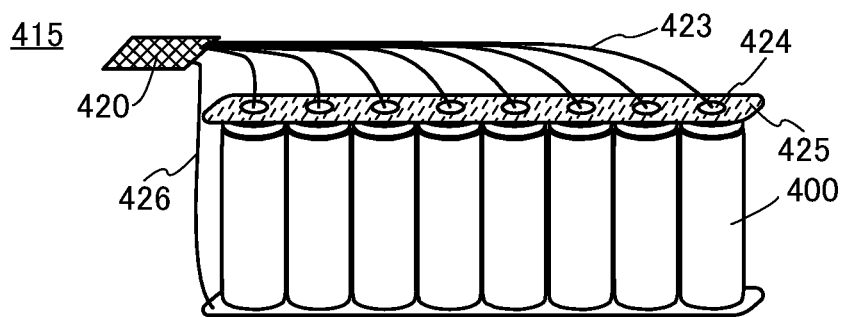

FIG. 16C illustrates an example of a power storage system 415. The power storage system 415 includes a plurality of secondary batteries 400. Positive electrodes of the secondary batteries are in contact with conductors 424 isolated by an insulator 425 and are electrically connected. The conductor 424 is electrically connected to a control circuit 420 through a wiring 423. Negative electrodes of the secondary batteries are electrically connected to the control circuit 420 through a wiring 426. As the control circuit 420, the battery control circuit described in the above embodiment can be used.

Figure 16D:
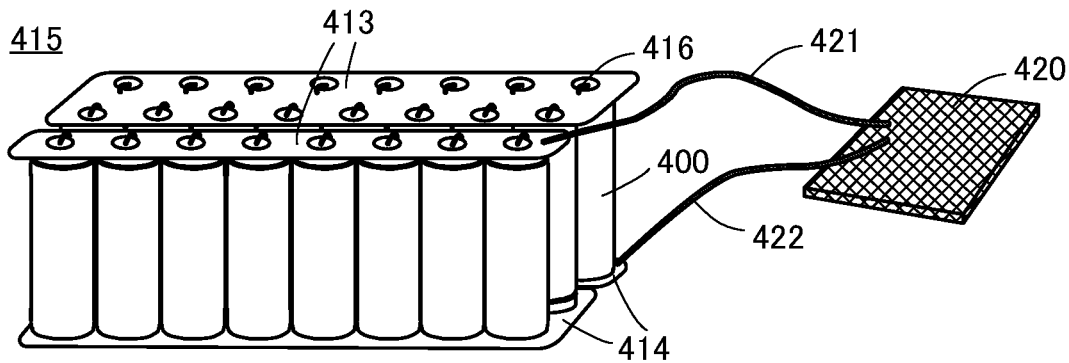

FIG. 16D illustrates an example of the power storage system 415. The power storage system 415 includes the plurality of secondary batteries 400, and the plurality of secondary batteries 400 are sandwiched between a conductive plate 413 and a conductive plate 414. The plurality of secondary batteries 400 are electrically connected to the conductive plate 413 and the conductive plate 414 through a wiring 416. The plurality of secondary batteries 400 may be connected parallel to each other, connected in series, or connected in series after being connected parallel to each other. With the power storage system 415 including the plurality of secondary batteries 400, large power can be extracted.

A temperature control device may be provided between the plurality of secondary batteries 400. When the secondary batteries 400 are heated excessively, the temperature control device can cool them, and when the secondary batteries 400 are cooled too much, the temperature control device can heat them. Thus, the performance of the power storage system 415 is not easily influenced by the outside air temperature.

In FIG. 16D, the power storage system 415 is electrically connected to the control circuit 420 through a wiring 421 and a wiring 422. As the control circuit 420, the battery control circuit described in the above embodiment can be used. The wiring 421 is electrically connected to the positive electrodes of the plurality of the secondary batteries 400 through the conductive plate 413, and the wiring 422 is electrically connected to the negative electrodes of the plurality of the secondary batteries 400 through the conductive plate 414.

Secondary Battery Pack

Next, examples of the power storage system of one embodiment of the present invention are described with reference to FIG. 17.

Figure 17A:
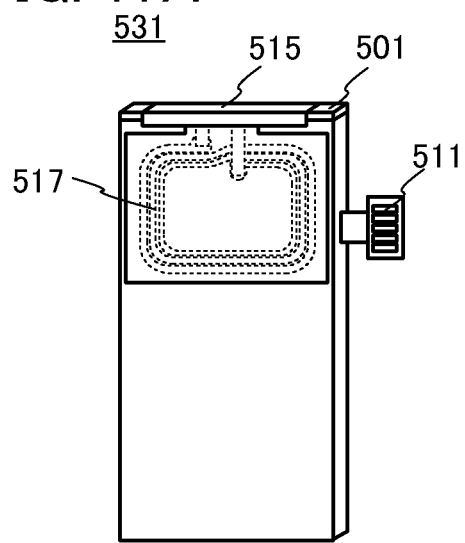
FIG. 17A, FIG. 17B, and FIG. 17C are diagrams illustrating electric devices of one embodiment of the present invention.
Figure 17B:
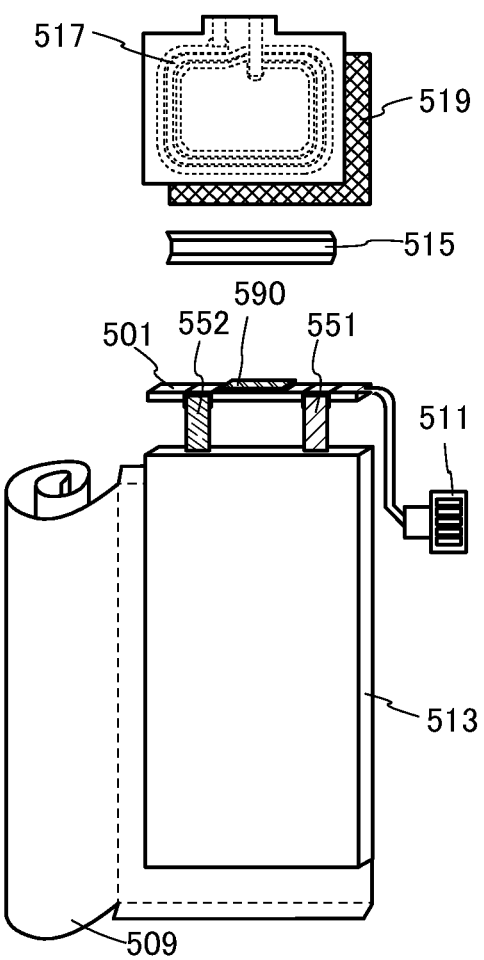

FIG. 17A is an external view of a secondary battery pack 531. FIG. 17B illustrates a structure of the secondary battery pack 531. The secondary battery pack 531 includes a circuit board 501 and a secondary battery 513. A label 509 is attached onto the secondary battery 513. The circuit board 501 is fixed by a sealant 515. The secondary battery pack 531 also includes an antenna 517.

The circuit board 501 includes a control circuit 590. As the control circuit 590, the battery control circuit described in the above embodiment can be used. For example, as illustrated in FIG. 17B, the control circuit 590 is provided over the circuit board 501. The circuit board 501 is electrically connected to a terminal 511. The circuit board 501 is electrically connected to the antenna 517, one 551 of a positive electrode lead and a negative electrode lead of the secondary battery 513, and the other 552 of the positive electrode lead and the negative electrode lead.

Figure 17C:
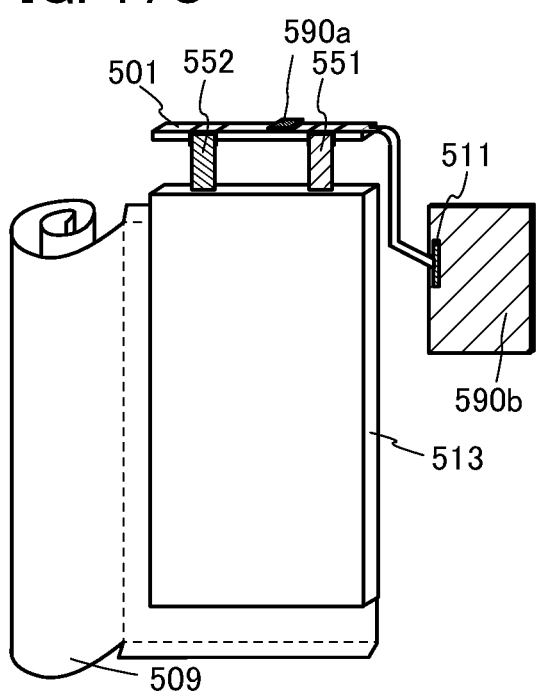

Alternatively, as illustrated in FIG. 17C, a circuit system 590a provided over the circuit board 501 and a circuit system 590b electrically connected to the circuit board 501 through the terminal 511 may be included. For example, a part of the control circuit of one embodiment of the present invention is provided in the circuit system 590*a*, and another part is provided in the circuit system 590*b*.

The shape of the antenna 517 is not limited to a coil shape and may be a linear shape or a plate shape. An antenna such as a planar antenna, an aperture antenna, a traveling-wave antenna, an EH antenna, a magnetic-field antenna, or a dielectric antenna may be used. Alternatively, an antenna 914 may be a flat-plate conductor. This flat-plate conductor can serve as one of conductors for electric field coupling. That is, the antenna 914 can serve as one of two conductors of a capacitor. Thus, power can be transmitted and received not only by an electromagnetic field or a magnetic field but also by an electric field.

The secondary battery pack 531 includes a layer 519 between the antenna 517 and the secondary battery 513. The layer 519 has a function of blocking an electromagnetic field from the secondary battery 513, for example. As the layer 519, for example, a magnetic body can be used.

This embodiment can be combined with any of the other embodiments as appropriate.

Embodiment 5

In this embodiment, examples of vehicles each including the power storage system that is one embodiment of the present invention will be described. Examples of vehicles include automobiles, motorcycles, bicycles, and the like.

The use of power storage systems in vehicles enables production of next-generation clean energy vehicles such as hybrid electric vehicles (HEVs), electric vehicles (EVs), and plug-in hybrid electric vehicles (PHEVs).

Figure 18A:
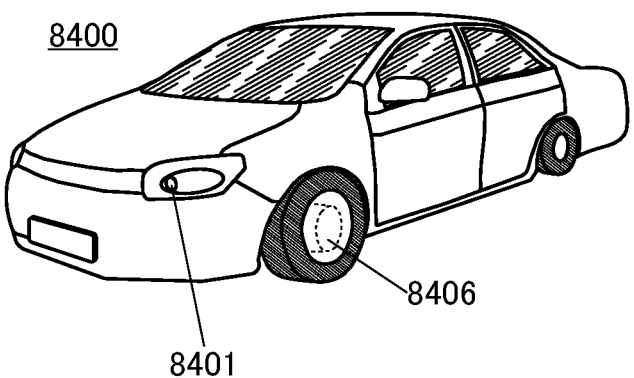
FIG. 18A, FIG. 18B, and FIG. 18C are diagrams illustrating electric devices of one embodiment of the present invention.

FIG. 18 illustrates examples of vehicles using the power storage system that is one embodiment of the present invention. An automobile 8400 illustrated in FIG. 18A is an electric vehicle that runs on the power of an electric motor. Alternatively, the automobile 8400 is a hybrid electric vehicle capable of driving using either an electric motor or an engine as appropriate. The use of one embodiment of the present invention can achieve a high-mileage vehicle. The automobile 8400 includes a power storage system. The power storage system is used not only for driving an electric motor 8406, but also for supplying power to a light-emitting device such as headlights 8401 or a room light (not illustrated).

The power storage system can also supply power to a display device of a speedometer, a tachometer, or the like included in the automobile 8400. Furthermore, the power storage system can supply power to a navigation system or the like included in the automobile 8400.

Figure 18B:
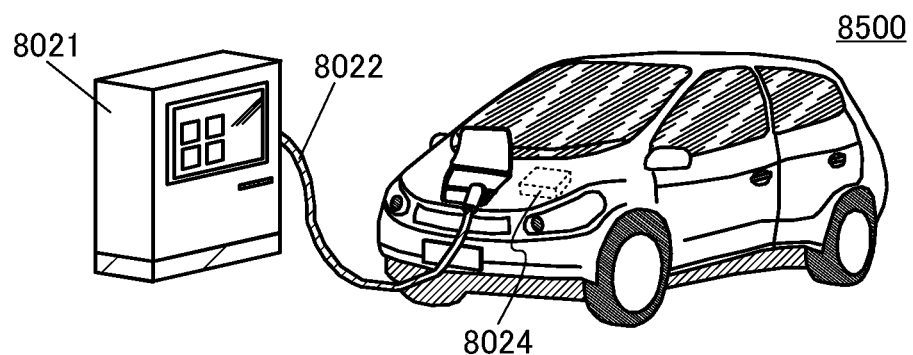

An automobile 8500 illustrated in FIG. 18B can be charged when a power storage system 8024 included in the automobile 8500 is supplied with power from external charging equipment by a plug-in system, a contactless power feeding system, or the like. FIG. 18B illustrates the state in which the power storage system 8024 included in the automobile 8500 is charged with a ground-based charging apparatus 8021 through a cable 8022. In charging, a given method such as CHAdeMO (registered trademark) or Combined Charging System may be employed as a charging method, the standard of a connector, or the like as appropriate. The charging apparatus 8021 may be a charging station provided in a commerce facility or a power source in a house. With the use of a plug-in technique, the power storage system 8024 included in the automobile 8500 can be charged by being supplied with power from the outside, for example. Charging can be performed by converting AC power into DC power through a converter such as an ACDC converter.

Although not illustrated, the vehicle can include a power receiving device so as to be charged by being supplied with power from an above-ground power transmitting device in a contactless manner. In the case of the contactless power feeding system, by fitting a power transmitting device in a road or an exterior wall, charging can be performed not only when the vehicle is stopped but also when driven. In addition, this contactless power feeding system may be utilized to transmit and receive power between vehicles. A solar cell may be provided in the exterior of the vehicle to charge the power storage system when the vehicle stops or moves. To supply power in such a contactless manner, an electromagnetic induction method or a magnetic resonance method can be used.

Figure 18C:
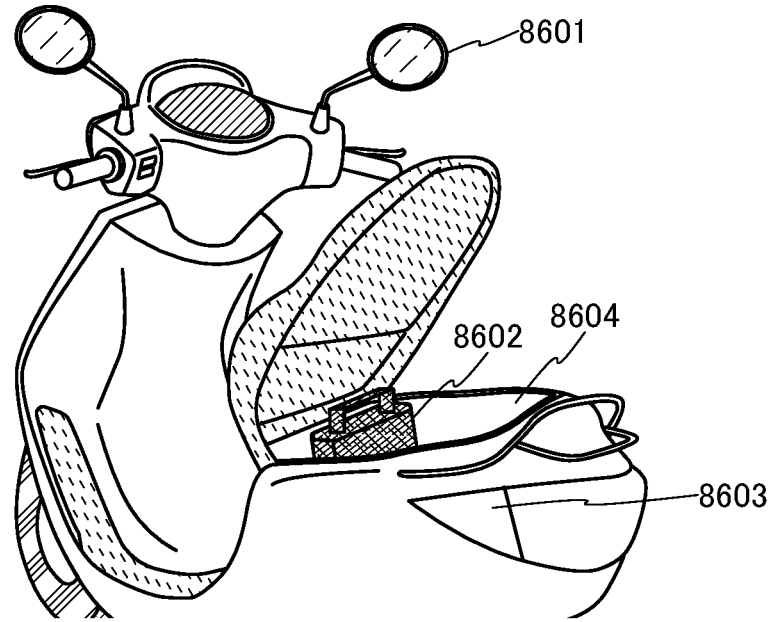

FIG. 18C is an example of a motorcycle using the power storage system of one embodiment of the present invention. A motor scooter 8600 illustrated in FIG. 18C includes a power storage system 8602, side mirrors 8601, and indicator lights 8603. The power storage system 8602 can supply electricity to the indicator lights 8603.

In the motor scooter 8600 illustrated in FIG. 18C, the power storage system 8602 can be stored in a storage unit under seat 8604. The power storage system 8602 can be stored in the storage unit under seat 8604 even with a small size.

Figure 19A:
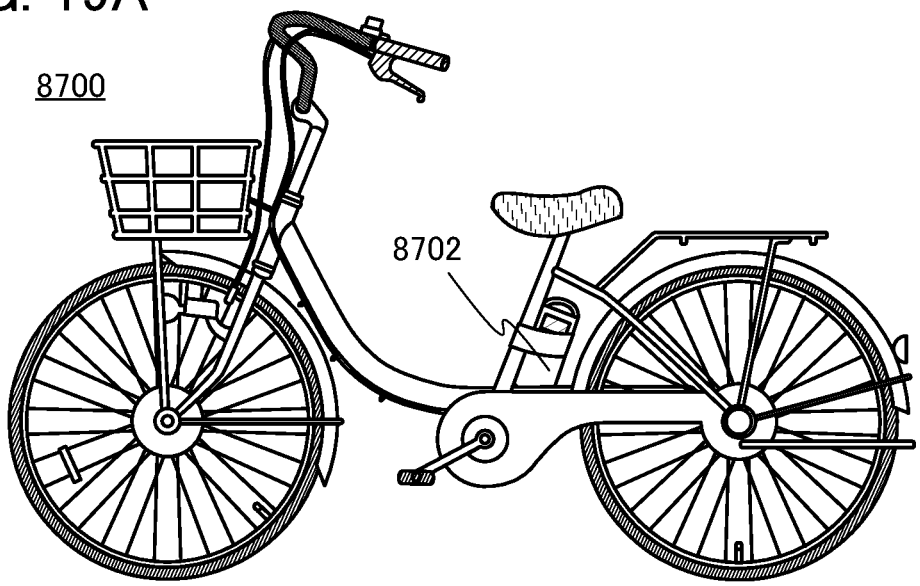
FIG. 19A and FIG. 19B are diagrams illustrating an electric device of one embodiment of the present invention.

FIG. 19A is an example of an electric bicycle using the power storage system of one embodiment of the present invention. The power storage system of one embodiment of the present invention can be used for an electric bicycle 8700 illustrated in FIG. 19A. The power storage system of one embodiment of the present invention includes a plurality of storage batteries, a protective circuit, and a neural network, for example.

Figure 19B:
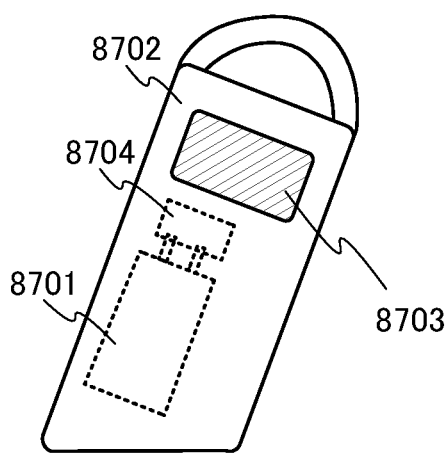

The electric bicycle 8700 includes a power storage system 8702. The power storage system 8702 can supply electricity to a motor that assists a rider. The power storage system 8702 is portable, and FIG. 19B illustrates the state where the power storage system 8702 is detached from the bicycle. A plurality of storage batteries 8701 included in the power storage system of one embodiment of the present invention are incorporated in the power storage system 8702, and the remaining battery capacity and the like can be displayed on a display portion 8703. The power storage system 8702 also includes a control circuit 8704 of one embodiment of the present invention. The control circuit 8704 is electrically connected to a positive electrode and a negative electrode of the storage battery 8701. The battery control circuit described in the above embodiment can be used as the control circuit 8704.

This embodiment can be combined with any of the other embodiments as appropriate.

Notes on Description of this Specification and the Like

The description of the above embodiments and each structure in the embodiments are noted below.

One embodiment of the present invention can be constituted by combining, as appropriate, the structure described in each embodiment with the structures described in the other embodiments. In addition, in the case where a plurality of structure examples are described in one embodiment, the structure examples can be combined as appropriate.

Note that content (or may be part of the content) described in one embodiment can be applied to, combined with, or replaced with another content (or may be part of the content) described in the embodiment and/or content (or may be part of the content) described in another embodiment or other embodiments.

Note that in each embodiment, content described in the embodiment is content described using a variety of diagrams or content described with text disclosed in the specification.

Note that by combining a diagram (or may be part thereof) described in one embodiment with another part of the diagram, a different diagram (or may be part thereof) described in the embodiment, and/or a diagram (or may be part thereof) described in another embodiment or other embodiments, much more diagrams can be formed.

In addition, in this specification and the like, components are classified by their functions and illustrated as independent blocks in block diagrams. However, in an actual circuit or the like, it is difficult to divide components according to their functions, and there are such a case where one circuit relates to a plurality of functions and a case where a plurality of circuits relate to one function. Therefore, blocks in the block diagrams are not limited by the components described in this specification, and the description can be changed appropriately depending on the situation.

Furthermore, in the drawings, the size, the layer thickness, or the region is shown with given magnitude for description convenience. Therefore, they are not limited to the illustrated scale. Note that the drawings are schematically shown for clarity, and embodiments of the present invention are not limited to shapes, values or the like shown in the drawings. For example, variation in signal, voltage, or current due to noise, variation in signal, voltage, or current due to difference in timing, or the like can be included.

In this specification and the like, the expressions "one of a source and a drain" (or a first electrode or a first terminal) and "the other of the source and the drain" (or a second electrode or a second terminal), which is for the other of the source and the drain, are used to describe the connection relation of a transistor. This is because the source and the drain of the transistor change depending on the structure, operating conditions, or the like of the transistor. Note that the source or the drain of the transistor can also be referred to as a source (drain) terminal, a source (drain) electrode, or the like as appropriate depending on the situation.

In addition, in this specification and the like, the terms "electrode" and "wiring" do not functionally limit these components. For example, an "electrode" is used as part of a "wiring" in some cases, and vice versa. Furthermore, the term "electrode" or "wiring" also includes the case where a plurality of "electrodes" or "wirings" are formed in an integrated manner, for example.

Furthermore, in this specification and the like, voltage and potential can be interchanged with each other as appropriate. The voltage refers to a potential difference from a reference potential, and when the reference potential is a ground voltage, for example, the voltage can be rephrased into the potential. The ground potential does not necessarily mean 0 V. Note that potentials are relative values, and a potential supplied to a wiring or the like is sometimes changed depending on the reference potential.

Note that in this specification and the like, the terms such as "film" and "layer" can be interchanged with each other depending on the case or according to circumstances. For example, the term "conductive layer" can be changed into the term "conductive film" in some cases. As another example, the term "insulating film" can be changed into the term "insulating layer" in some cases.

In this specification and the like, a switch has a function of controlling whether current flows or not by being in a conduction state (an on state) or a non-conduction state (an off state). Alternatively, a switch has a function of selecting and changing a current path.

In this specification and the like, channel length refers to, for example, the distance between a source and a drain in a region where a semiconductor (or a portion where current flows in a semiconductor when a transistor is in an on state) and a gate overlap with each other or a region where a channel is formed in a top view of the transistor.

In this specification and the like, channel width refers to, for example, the length of a portion where a source and a drain face each other in a region where a semiconductor (or a portion where current flows in a semiconductor when a transistor is in an on state) and a gate electrode overlap with each other or a region where a channel is formed.

In this specification and the like, when A and B are connected, it means the case where A and B are electrically connected to each other as well as the case where A and B are directly connected to each other. Here, when A and B are electrically connected, it means the case where electric signals can be sent and received between A and B when an object having any electric action exists between A and B.

REFERENCE NUMERALS

CA1: wiring, CA2: wiring, V1: signal, V2: signal, Vin2: signal, VREF1: reference voltage, VREF2: reference voltage, 10: power supply circuit, 11: load, 12: current data sensing portion, 13: voltage data sensing portion, 14: voltage control circuit, 15: power converter circuit, 16: power source, 17: processor, 21: voltage sensing circuit, 22: current sensing circuit, 23: correction circuit, 24: selection circuit, 25: precharge circuit, 26: output circuit, 27: control signal generation circuit, 30: capacitor, 31: capacitor, 32: resistor, 33: resistor, 34: resistor, 35: resistor, 36: switch, 37: filter circuit, 41: Gm amplifier, 42: analog-digital converter circuit, 43: digital-analog converter circuit, 44: sample-and-hold circuit, 45: transistor, 46: capacitor

The invention claimed is:

1. A power supply circuit comprising:
a power converter circuit configured to supply power to a load;
a current sensing circuit configured to generate a first signal comprising data on current flowing through the load;
a voltage sensing circuit configured to generate a second signal comprising data on voltage applied to the load;
a correction circuit comprising a digital filter, a digital-analog converter circuit to which a signal output from the digital filter is input, and a sample-and-hold circuit for retaining a signal output from the digital-analog converter circuit, the correction circuit configured to generate a third signal obtained by correcting the second signal;
a selection circuit configured to select one of the first signal and the third signal;
an output circuit configured to generate an output signal for controlling the power converter circuit in accordance with a signal selected by the selection circuit; and
a control signal generation circuit configured to control switching between a first operation for generating the output signal in accordance with the first signal and generating the third signal and a second operation for generating the output signal in accordance with the third signal.

2. The power supply circuit according to claim 1,
wherein the sample-and-hold circuit comprises a first transistor and a first capacitor, and
wherein the first transistor comprises an oxide semiconductor in a channel formation region.

3. The power supply circuit according to claim 1,
wherein the selection circuit comprises a first wiring electrically connected to a second capacitor, a second wiring electrically connected to a third capacitor, and a change-over switch, and
wherein the change-over switch is configured to switch the first operation and the second operation so that in the first operation, the first signal is retained in the first wiring and the first signal is input to the output circuit and in the second operation, the third signal is retained in the second wiring and the second signal is input to the output circuit.

4. The power supply circuit according to claim 3, further comprising a precharge circuit,
wherein the change-over switch is configured to switch the precharge circuit so as to precharge the second wiring in the first operation and to precharge the first wiring in the second operation.

5. A semiconductor device comprising:
the power supply circuit according to claim to claim 1; and
a processor.

* * * * *